(12) United States Patent
Saito

(10) Patent No.: US 7,642,597 B2
(45) Date of Patent: Jan. 5, 2010

(54) POWER SEMICONDUCTOR DEVICE

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 11/939,050

(22) Filed: Nov. 13, 2007

(65) Prior Publication Data
US 2008/0135930 A1     Jun. 12, 2008

(30) Foreign Application Priority Data
Nov. 14, 2006    (JP)   ............... 2006-308406

(51) Int. Cl.
*H01L 27/088*     (2006.01)
(52) U.S. Cl. .............. 257/341; 257/287; 257/401; 257/498; 257/678; 257/E29.02; 257/E29.016; 257/E29.136; 257/E29.201; 257/E29.257; 257/E29.338
(58) Field of Classification Search .............. 257/287, 257/341, 401, 578, E29.02, E29.201, E29.257, 257/E29.338, 498, E29.016, E29.136
See application file for complete search history.

(56) References Cited
U.S. PATENT DOCUMENTS
5,637,898 A * 6/1997 Baliga .............. 257/330

| 6,750,508 | B2 | 6/2004 | Omura et al. |
| 6,825,537 | B2 | 11/2004 | Iwamoto et al. |
| 6,888,195 | B2 | 5/2005 | Saito et al. |
| 2002/0175351 | A1* | 11/2002 | Baliga ............ 257/242 |
| 2006/0138536 | A1 | 6/2006 | Kouzuki et al. |
| 2007/0018243 | A1 | 1/2007 | Ono et al. |

FOREIGN PATENT DOCUMENTS
JP    2001-111050    4/2001

* cited by examiner

*Primary Examiner*—Long K Tran
(74) *Attorney, Agent, or Firm*—Oblon, Spivak, McClelland, Maier & Neustadt, L.L.P.

(57) ABSTRACT

A power semiconductor device includes a semiconductor substrate having a plurality of trenches formed in an upper surface thereof; a buried insulating film; a buried field plate electrode; a control electrode; a first main electrode provided on a lower side of the semiconductor substrate; and a second main electrode provided on an upper side of the semiconductor substrate. The semiconductor substrate includes: a first semiconductor; a second semiconductor layer of the first conductivity type and a third semiconductor layer of a second conductivity type; a fourth semiconductor layer; and a fifth semiconductor layer. The buried insulating film is thicker than a gate insulating film. At least one of the second semiconductor layer and the third semiconductor layer has a portion with its sheet dopant concentration varying along a depth direction of the semiconductor substrate.

20 Claims, 25 Drawing Sheets

POWER SEMICONDUCTOR DEVICE

CROSS-REFERENCE TO RELATED APPLICATIONS

This application is based upon and claims the benefit of priority from the prior Japanese Patent Application No. 2006-308406, filed on Nov. 14, 2006; the entire contents of which are incorporated herein by reference.

BACKGROUND OF THE INVENTION

1. Field of the Invention

This invention relates to a power semiconductor device, and more particularly to a power semiconductor device having a super junction structure.

2. Background Art

The ON resistance of a power semiconductor device such as a vertical power MOSFET (metal oxide semiconductor field effect transistor) greatly depends on the electric resistance of its conduction layer (drift layer). The dopant concentration that determines the electric resistance of the drift layer cannot exceed a maximum limit, which depends on the breakdown voltage of a pn junction between the base layer and the drift layer. Thus there is a tradeoff between the device breakdown voltage and the ON resistance. Improving this tradeoff is important for enhancing the performance of low power consumption devices. This tradeoff has a limit determined by the device material. Overcoming this limit is the way to realizing devices with low ON resistance beyond existing power devices.

As an example MOSFET overcoming this limit, a MOSFET having a structure called a super junction structure is known, where p-pillar layers and n-pillar layers are alternately buried in the drift layer. In the super junction structure, a non-doped layer is artificially produced by equalizing the amount of charge (amount of dopant) contained in the p-pillar layer with the amount of charge contained in the n-pillar layer. Thus, while holding high breakdown voltage, a current is passed through the highly doped n-pillar layer. Hence low ON resistance beyond the material limit can be achieved.

In such a MOSFET with a super junction structure formed in the drift layer, the pillar layers can be completely depleted even at a low applied voltage by decreasing the repetition period of p-pillar layers and n-pillar layers, and high breakdown voltage can be achieved. Hence, with the decrease of the repetition period of pillar layers, the dopant concentration in the pillar layers can be increased, and the ON resistance can be decreased. However, unfortunately, the decrease of the repetition period of the super junction structure will increase processing difficulty.

Hence a structure is proposed where a trench is formed in the n-pillar layer and an insulating film and an electrode are buried in the trench (see, e.g., JP-A 2001-111050 (Kokai)). By burying the electrode in the n-pillar layer, the super junction structure is easily depleted at a lower voltage. Thus the pillar concentration can be further increased, and a lower ON resistance can be achieved.

However, upon application of high voltage, electric field concentration occurs at the bottom of the trench because of the electrode buried in the trench. When the electric field strength increases at the bottom of the trench and causes avalanche breakdown, holes generated by the breakdown are injected into the insulating film in the trench and degrade the insulation of the insulating film. Thus local electric field concentration degrades the long-term reliability of the device.

SUMMARY OF THE INVENTION

According to an aspect of the invention, there is provided a power semiconductor device including: a semiconductor substrate having a plurality of trenches formed in an upper surface thereof; a buried insulating film formed on an inner surface of the trench; a buried field plate electrode buried in the trench; a control electrode insulated from the semiconductor substrate by a gate insulating film; a first main electrode provided on a lower side of the semiconductor substrate; and a second main electrode provided on an upper side of the semiconductor substrate, the semiconductor substrate including: a first semiconductor layer of a first conductivity type with its lower surface connected to the first main electrode; a second semiconductor layer of the first conductivity type and a third semiconductor layer of a second conductivity type formed on the first semiconductor layer and alternately arranged parallel to the upper surface of the semiconductor substrate; a fourth semiconductor layer of the second conductivity type formed above the second semiconductor layer and the third semiconductor layer and connected to the second main electrode; and a fifth semiconductor layer of the first conductivity type selectively formed in an upper surface of the fourth semiconductor layer and connected to the second main electrode, the buried insulating film being thicker than the gate insulating film, at least one of the second semiconductor layer and the third semiconductor layer having a portion with its sheet dopant concentration varying along depth direction of the semiconductor substrate, the sheet dopant concentration in the third semiconductor layer being higher than the sheet dopant concentration in the second semiconductor layer in an upper part of the portion with varying sheet dopant concentration, and the sheet dopant concentration in the third semiconductor layer being lower than the sheet dopant concentration in the second semiconductor layer in a lower part of the portion.

According to another aspect of the invention, there is provided a power semiconductor device including: a semiconductor substrate having a plurality of trenches formed in an upper surface thereof; a buried insulating film formed on an inner surface of the trench; a buried field plate electrode buried in the trench; a control electrode insulated from the semiconductor substrate by a gate insulating film; a first main electrode provided on a lower side of the semiconductor substrate; and a second main electrode provided on an upper side of the semiconductor substrate, the semiconductor substrate including: a first semiconductor layer of a first conductivity type with its lower surface connected to the first main electrode; a second semiconductor layer of the first conductivity type and a third semiconductor layer of a second conductivity type formed on the first semiconductor layer and alternately arranged parallel to the upper surface of the semiconductor substrate; a fourth semiconductor layer of the second conductivity type formed above the second semiconductor layer and the third semiconductor layer and connected to the second main electrode; and a fifth semiconductor layer of the first conductivity type selectively formed in an upper surface of the fourth semiconductor layer and connected to the second main electrode, electric field strength in the second semiconductor layer and the third semiconductor layer along depth direction of the semiconductor substrate having a maximum value in a part other than an upper end and a lower end of the second semiconductor layer and the third semiconductor layer.

DETAILED DESCRIPTION OF THE INVENTION

Figure 1:
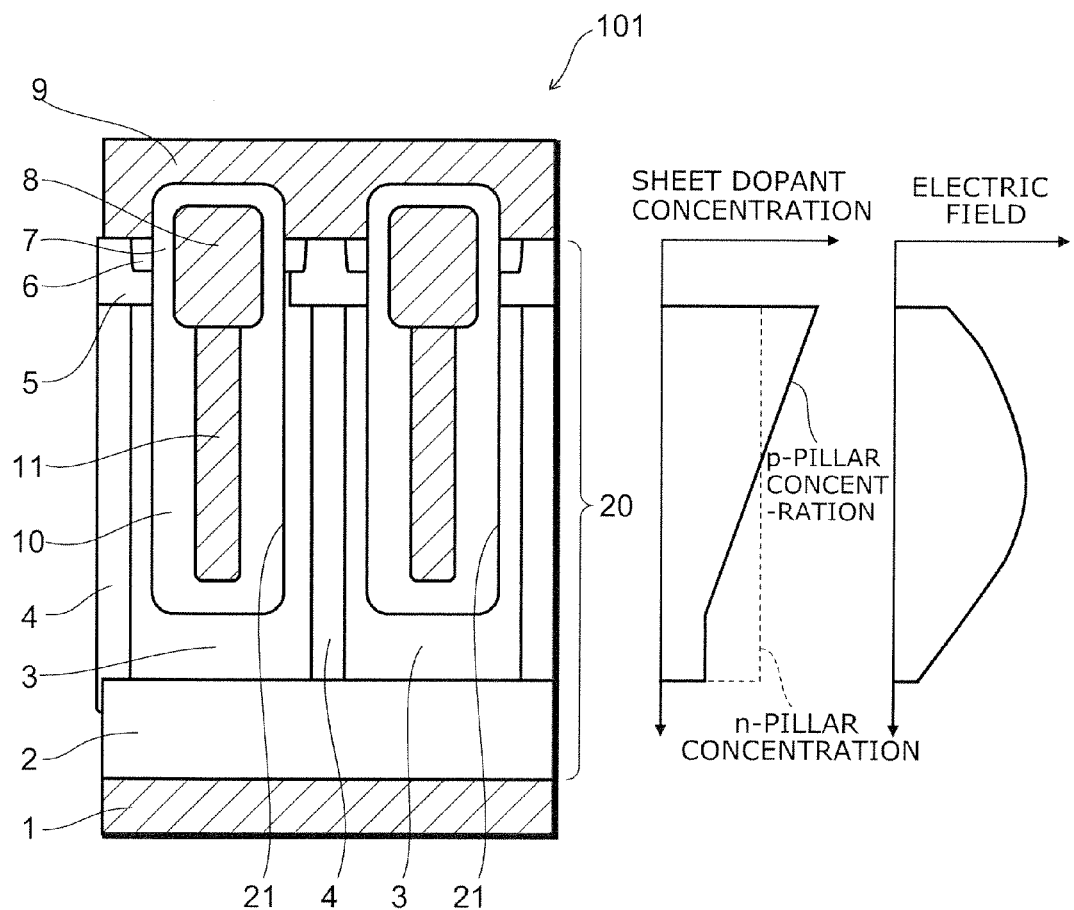
FIG. 1 is a cross-sectional view schematically illustrating a power MOSFET according to a first embodiment of the invention, and schematic graphs illustrating sheet dopant concentration and electric field strength in its pillar layers in correlation with position along the depth direction.

Embodiments of the invention will now be described with reference to the drawings. In the following embodiments, a power MOSFET is described as an example of power semiconductor devices. In the following embodiments, it is assumed that the first conductivity type and the second conductivity type are n-type and p-type, respectively. Like elements in the drawings are marked with like reference numerals.

FIRST EMBODIMENT

FIG. 1 shows a cross-sectional view schematically illustrating a power MOSFET according to a first embodiment of the invention, and schematic graphs illustrating sheet dopant concentration and electric field strength in its pillar layers in correlation with position along the depth direction.

It is noted that FIG. 1 shows only the cell section of the power MOSFET. The same also applies to FIGS. 2 to 17 described below. The term "sheet dopant concentration" in the pillar layer refers to a value given by the product of dopant concentration and pillar width at an arbitrary position along the depth direction of the pillar layer.

As shown in FIG. 1, the power MOSFET 101 according to this embodiment includes a semiconductor substrate 20, which is illustratively an n-type silicon substrate. An $n^+$-drain layer 2 serving as a first semiconductor layer is formed in the lower portion of the semiconductor substrate 20. A drain electrode 1 serving as a first main electrode is provided on the lower side of the semiconductor substrate 20. Thus the lower surface of the $n^+$-drain layer 2 is connected to the drain electrode 1.

Above the $n^+$-drain layer 2 in the semiconductor substrate 20, a plurality of striped n-pillar layers 3 (second semiconductor layers) and p-pillar layers 4 (third semiconductor layers) are formed. The n-pillar layers 3 and p-pillar layers 4 are alternately and periodically arranged parallel to the upper surface of the semiconductor substrate 20 to form a super junction structure. The portion composed of the n-pillar layers 3 and p-pillar layers 4 constituting the super junction structure is hereinafter referred to as the "drift layer". A p-base layer 5 serving as a fourth semiconductor layer is formed on the drift layer.

Furthermore, a plurality of trenches 21 are formed parallel to each other in the upper surface of the semiconductor substrate 20. Each trench 21 extends in a striped configuration along the extending direction of the n-pillar layers 3 and p-pillar layers 4. The trench 21 passes through the p-base layer 5, enters an n-pillar layer 3, and reaches the lower portion of the n-pillar layer 3. However, the trench 21 does not reach the n$^+$-drain layer 2, but the n-pillar layer 3 is interposed between the bottom of the trench 21 and the n$^+$-drain layer 2. In the upper surface of the p-base layer 5 partitioned by the trenches 21, an n-source layer 6 serving as a fifth semiconductor layer is formed in a striped configuration in contact with the trench 21. That is, the n-source layer 6 is selectively formed in part of the upper surface of the p-base layer 5.

A buried insulating film 10 is formed on the inner surface of the trench 21 except its upper portion. A buried field plate electrode 11 illustratively made of polysilicon is provided on the buried insulating film 10. Thus the buried field plate electrode 11 is buried in the trench 21 and insulated from the semiconductor substrate 20 by the buried insulating film 10. A gate insulating film 7 is formed on the inner surface of the upper portion of the trench 21. A gate electrode 8 illustratively made of polysilicon is provided as a control electrode on the gate insulating film 7.

The gate electrode 8 and the buried field plate electrode 11 are integrally formed, with the gate electrode 8 located on the buried field plate electrode 11. Thus the buried field plate electrode 11 is connected to the gate electrode 8. Furthermore, the gate electrode 8 and the buried field plate electrode 11 extend parallel to the n-pillar layer 3 in a striped configuration. The upper portion of the gate electrode 8 is projected from the trench 21, and hence protrudes from the upper surface of the semiconductor substrate 20. The gate insulating film 7 covers this upper portion of the gate electrode 8 as well. Thus the gate electrode 8 is insulated from the semiconductor substrate 20 by the gate insulating film 7. Moreover, both the buried insulating film 10 and the gate insulating film 7 are illustratively silicon oxide films. The buried insulating film 10 is thicker than the gate insulating film 7. For example, the buried insulating film 10 has a thickness of approximately 1 to 2 μm, and the gate insulating film 7 has a thickness of approximately 0.1 μm.

On the other hand, a source electrode 9 serving as a second main electrode is provided on the upper side of the semiconductor substrate 20 so as to cover the gate insulating film 7. The lower surface of the source electrode 9 is in contact with the upper surface of the semiconductor substrate 20. Thus the source electrode 9 is connected to the p-base layer 5 and the n-source layer 6.

In the portion of the drift layer between the trenches 21, the sheet dopant concentration in the p-pillar layer 4 (hereinafter also referred to as "p-pillar concentration") varies continuously along the depth direction, being highest at the upper end of the p-pillar layer 4 and decreasing downward. Here, the term "depth direction" refers to the thickness direction of the semiconductor substrate 20. In this embodiment, it is the direction from the source electrode 9 to the drain electrode 1, which is orthogonal to the arranging direction of the n-pillar layers 3 and p-pillar layers 4 (hereinafter also simply referred to as "arranging direction"). On the other hand, the sheet dopant concentration in the n-pillar layer 3 (hereinafter also referred to as "n-pillar concentration") is constant along the depth direction. Consequently, in the upper part of the portion of the drift layer between the trenches 21, that is, in the portion on the source electrode 9 side thereof, the sheet dopant concentration in the p-pillar layer 4 (p-pillar concentration) is higher than the sheet dopant concentration in the n-pillar layer 3 (n-pillar concentration), and in the lower part, that is, in the portion on the drain electrode 1 side, the n-pillar concentration is higher than the p-pillar concentration. In contrast, in the portion of the drift layer below the trench 21, the p-pillar concentration and the n-pillar concentration are constant along the depth direction, and the n-pillar concentration is higher than the p-pillar concentration.

Next, the operation and effect of this embodiment are described.

In the power MOSFET 101, under the condition where a voltage is applied between the source electrode 9 and the drain electrode 1 with the source electrode 9 being negative and the drain electrode 1 being positive, when the same potential as the potential of the source electrode 9 is applied to the gate electrode 8, and the power MOSFET 101 is turned into the OFF state. At this time, from the pn junction interface between the n-pillar layer 3 and the p-pillar layer 4, the depletion layer extends into the n-pillar layer 3 and into the p-pillar layer 4. This depletion layer and the buried insulating film 10 serve to hold the breakdown voltage. On the other hand, upon application of a positive potential to the gate electrode 8, an inversion channel is formed in the region of the p-base layer 5 between the n-source layer 6 and the n-pillar layer 3, and the n-source layer 6 becomes electrically continuous with the n-pillar layer 3. Thus the power MOSFET 101 is turned into the ON state.

In the OFF state of the power MOSFET 101, the potential of the gate electrode 8 is propagated deep into the n-pillar layer 3 through the buried field plate electrode 11, and hence the depletion layer easily extends into the drift layer. Furthermore, besides the depletion layer formed in the drift layer, the buried insulating film 10 also serves to hold the voltage. Thus the power MOSFET 101 has a structure favorable to the breakdown voltage. Hence, if the breakdown voltage is left constant, the dopant concentration in the drift layer can be increased accordingly, and the ON resistance can be decreased. In the ON state, the potential of the gate electrode 8 is propagated to the buried field plate electrode 11. Hence an accumulation channel is formed also in the region of the n-pillar layer 3 lateral to the trench 21, that is, near the interface of the n-pillar layer 3 with the buried insulating film 10. If an accumulation channel is formed, an effect similar to increasing the dopant concentration in the n-pillar layer 3 is achieved. Hence the ON resistance can be further decreased.

However, if the sheet dopant concentration in the n-pillar layer 3 and the p-pillar layer 4 were constant along the depth direction, electric field would concentrate at the bottom of the p-base layer 5 or the bottom of the trench 21 when the drift layer is completely depleted. More specifically, electric field concentrates at the bottom of the p-base layer 5 if the n-pillar concentration is higher than the p-pillar concentration, and electric field concentrates at the bottom of the trench 21 if the p-pillar concentration is higher than the n-pillar concentration. If electric field concentrates at the bottom of the p-base layer 5, negative resistance is likely to occur at the time of avalanche breakdown, causing current concentration and destroying the device. That is, a sufficient avalanche withstand capability cannot be ensured. On the other hand, if electric field concentrates at the bottom of the trench 21, holes generated at the time of avalanche breakdown are injected into the buried insulating film 10, and hence degrade the buried insulating film 10. Hence the device has low reliability in both cases.

In contrast, in this embodiment, the dopant profile in the pillar layers is sloped as described above. Thus the peak position of the electric field strength is located midway between the bottom of the p-base layer 5 and the bottom of the trench 21. Hence the electric field strength at the upper and lower end of the drift layer can be made lower than the electric field strength at the center of the drift layer along the depth direction, and thereby the electric field strength at the bottom of the p-base layer 5 and the bottom of the trench 21 can be decreased. Thus, according to this embodiment, the electric field peak can be positioned in the vicinity of the center of the trench along the depth direction. Hence occurrence of negative resistance at the time of avalanche breakdown can be prevented, and high avalanche withstand capability can be achieved. Furthermore, by decreasing the electric field at the trench bottom, hole generation due to avalanche breakdown can be prevented, and hence high reliability can be achieved. Thus, according to this embodiment, a power MOSFET having low ON resistance and high reliability can be obtained.

In this embodiment, the method for forming the super junction structure and the field plate electrode is not particularly limited. The super junction structure having the above dopant concentration profile can be formed, for example, by any one of a method of repeating ion implantation and buried crystal growth, a method based on implantation of highly accelerated ions, and a method of buried growth of silicon in the trench. The buried field plate electrode 11 can be realized, for example, by a method where a trench 21 is formed, a buried insulating film 10 is then formed by thermal oxidation, a buried field plate electrode 11 is buried, the buried insulating film 10 is then etched back, and a gate insulating film 7 and a gate electrode 8 are then formed. Alternatively, a trench is formed, Si nitride film is deposited on the sidewall of the trench, trench etching is then performed again, followed by selective oxidation to form a thick buried insulating film, polycrystalline silicon is buried in the trench, and thus a buried field plate electrode 11 and a gate electrode 8 can be integrally formed. Thus various processes can be used to form a power MOSFET according to this embodiment.

Next, a first variation of the first embodiment is described.

Figure 2:
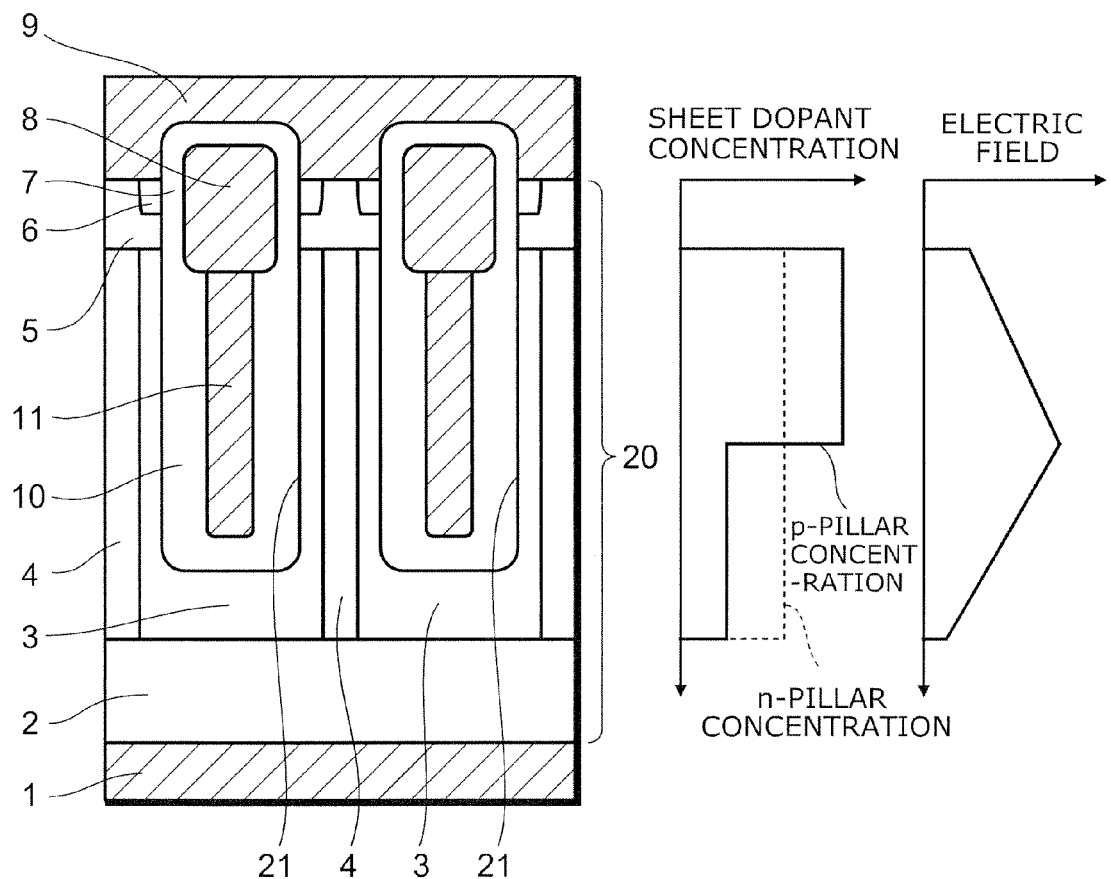
FIG. 2 is a cross-sectional view schematically illustrating a power MOSFET according to a first variation of the first embodiment, and schematic graphs illustrating sheet dopant concentration and electric field strength in its pillar layers in correlation with position along the depth direction.

FIG. 2 shows a cross-sectional view schematically illustrating a power MOSFET according to this variation, and schematic graphs illustrating sheet dopant concentration and electric field strength in its pillar layers in correlation with position along the depth direction.

As shown in FIG. 2, in this variation, the sheet dopant concentration in the p-pillar layer 4 varies stepwise. This also serves to achieve the same effect as that of the first embodiment described above. While FIG. 2 illustrates two-step variation of dopant concentration, it may be varied in three or more steps. The configuration, operation, and effect in this variation other than the foregoing are the same as those in the first embodiment described above.

In the profile illustrated in the first embodiment described above and this variation, the p-pillar concentration is high in the upper portion and low in the lower portion while the n-pillar concentration is left constant. However, the invention is not limited thereto. The same effect is achieved also by increasing the n-pillar concentration downward, or by varying both the p-pillar concentration and the n-pillar concentration. Alternatively, the width of the p-pillar layer may be varied so as to be thick in the upper portion and thin in the lower portion while the dopant concentration in the n-pillar layer and the p-pillar layer is left constant along the depth direction. Then the profile of sheet dopant concentration given by the product of the width of the p-pillar layer and the dopant concentration therein (p-pillar concentration) can be made high in the upper portion and low in the lower portion. Thus the drift layer has a portion where the sheet dopant concentration in at least one of the n-pillar layer 3 and the p-pillar layer 4 varies along the depth direction of the semiconductor substrate 20, and it is sufficient that in this portion where the sheet dopant concentration varies, the p-pillar concentration is higher than the n-pillar concentration in the upper part thereof and the p-pillar concentration is lower than the n-pillar concentration in the lower part thereof. The electric field distribution in the drift layer is determined by the sheet dopant concentration. Hence, even if the width of each pillar layer varies along the depth direction, high avalanche withstand capability and high reliability can be achieved when the sheet dopant concentration satisfies the above relationship.

Next, a second variation of the first embodiment is described.

Figure 3:
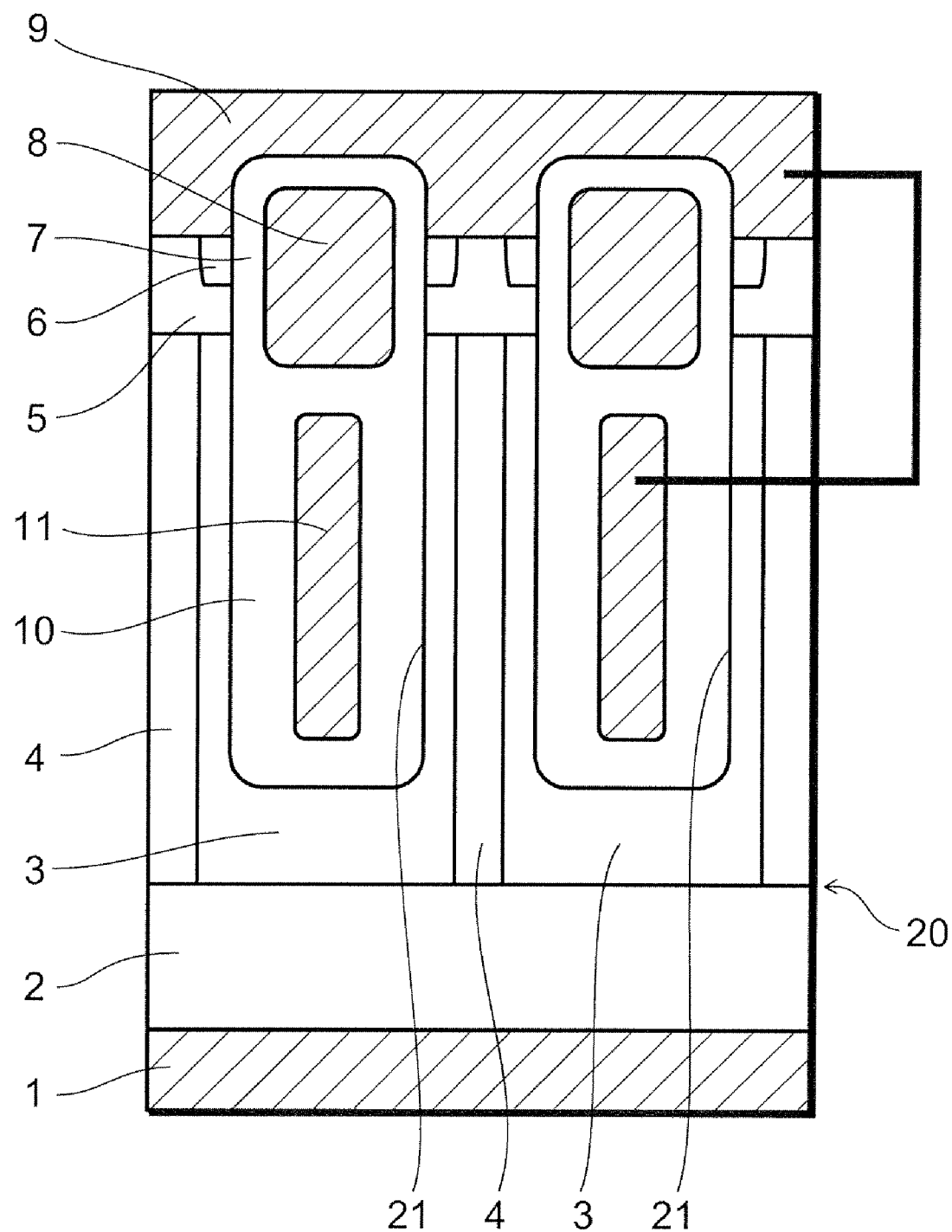
FIG. 3 is a cross-sectional view schematically illustrating a power MOSFET according to a second variation of the first embodiment.

FIG. 3 is a cross-sectional view schematically illustrating a power MOSFET according to this variation.

As shown in FIG. 3, in this variation, the buried field plate electrode 11 is connected not to the gate electrode 8 but to the source electrode 9. Hence, during the ON state of the power MOSFET, no accumulation channel is formed at the interface between the buried insulating film 10 and the n-pillar layer 3. However, because the gate-drain capacitance decreases, the switching time of the gate electrode 8 is reduced, enabling fast operation. The configuration, operation, and effect in this variation other than the foregoing are the same as those in the first embodiment described above.

Next, a third variation of the first embodiment is described.

Figure 4:
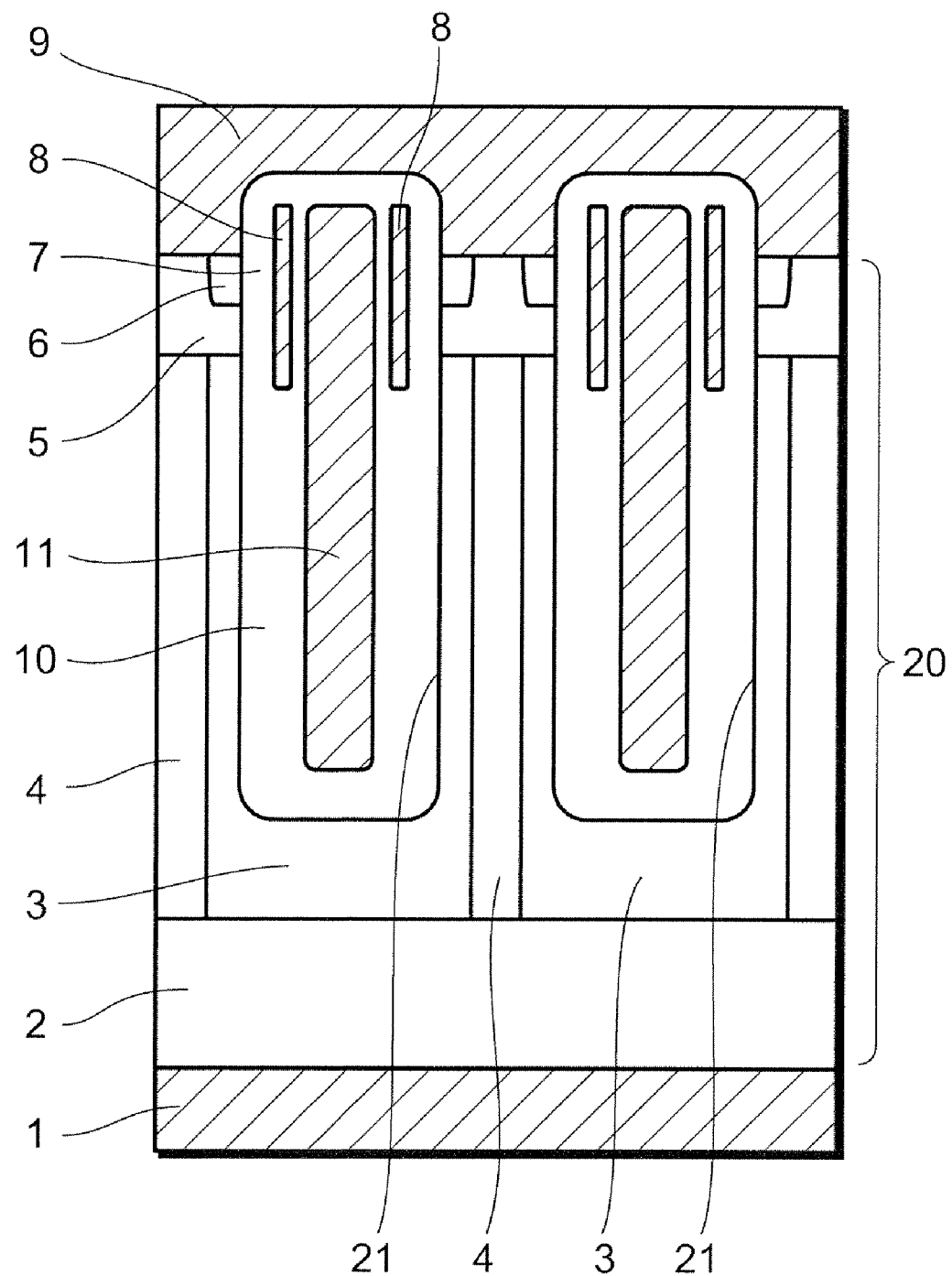
FIG. 4 is a cross-sectional view schematically illustrating a power MOSFET according to a third variation of the first embodiment.

FIG. 4 is a cross-sectional view schematically illustrating a power MOSFET according to this variation.

As shown in FIG. 4, in this variation, the upper end of the buried field plate electrode 11 is projected from the trench 21, protrudes from the upper surface of the semiconductor substrate 20, and is covered with the buried insulating film 10. The gate electrode 8 is provided on both sides of the upper portion of the buried field plate electrode 11. The buried field plate electrode 11 is connected to the gate electrode 8 or the source electrode 9. Such a configuration can be realized by burying a buried insulating film 10 and a buried field plate electrode 11 in the trench 21, then etching and removing halfway through the buried insulating film 10, and forming a gate insulating film 7 and a gate electrode 8 in the removed portion. The configuration, operation, and effect in this variation other than the foregoing are the same as those in the first embodiment described above.

Next, a fourth variation of the first embodiment is described.

Figure 5:
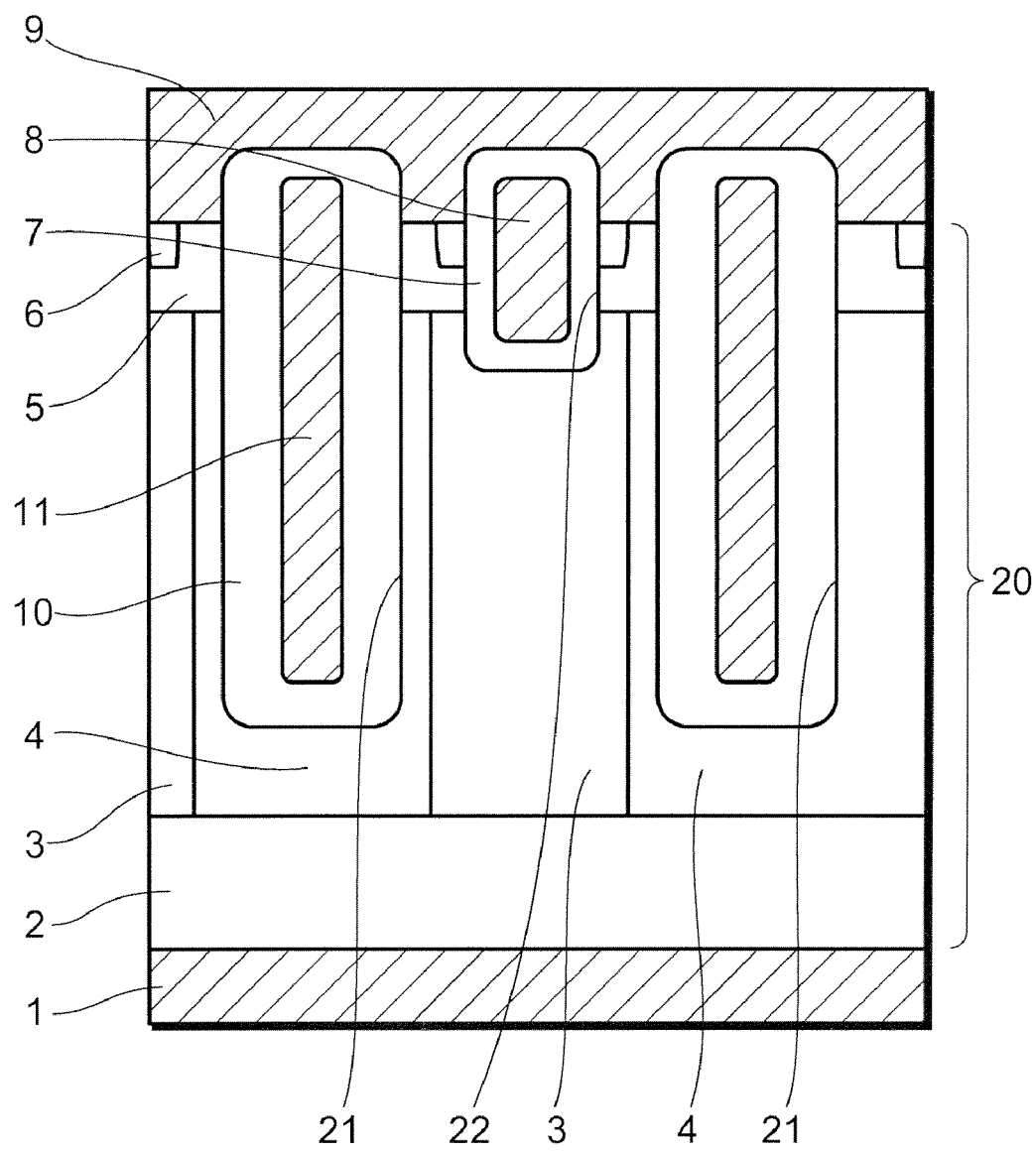
FIG. 5 is a cross-sectional view schematically illustrating a power MOSFET according to a fourth variation of the first embodiment.

FIG. 5 is a cross-sectional view schematically illustrating a power MOSFET according to this variation.

As shown in FIG. 5, in this variation, the trench 21 is formed so as to enter not the n-pillar layer 3 but the p-pillar layer 4. In the trench 21, only the buried insulating film 10 and the buried field plate electrode 11 are buried.

On the other hand, a trench 22 is formed in the region of the upper surface of the semiconductor substrate 20 between the trenches 21. The trench 22 extends parallel to the trench 21 in a striped configuration, passes through the p-base layer 5, and enters the n-pillar layer 3. A gate insulating film 7 is formed on the inner surface of the trench 22, and a gate electrode 8 is formed thereon. Thus the gate electrode 7 except its upper portion is buried in the trench 22. The bottom of the trench 22 is located shallower than the bottom of the trench 21. The upper end of the gate electrode 8 is located generally as high as the upper end of the buried field plate electrode 11. The n-source layer 6 is formed in a region of the upper surface of the p-base layer 5 in contact with the trench 22. The configuration, operation, and effect in this variation other than the foregoing are the same as those in the first embodiment described above.

SECOND EMBODIMENT

Figure 6:
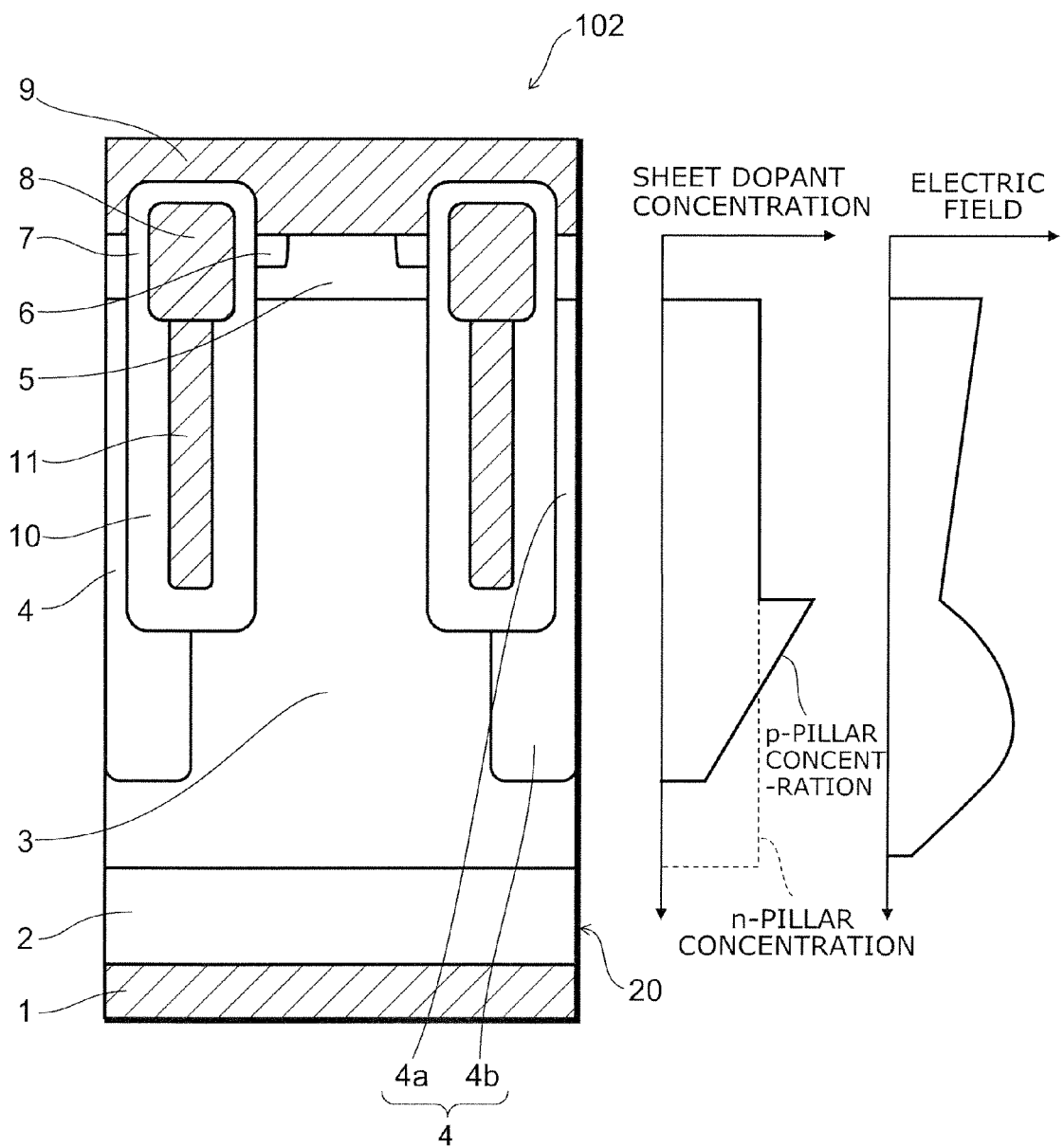
FIG. 6 is a cross-sectional view schematically illustrating a power MOSFET according to a second embodiment of the invention, and schematic graphs illustrating sheet dopant concentration and electric field strength in its pillar layers in correlation with position along the depth direction.

FIG. 6 shows a cross-sectional view schematically illustrating a power MOSFET according to a second embodiment of the invention, and schematic graphs illustrating sheet dopant concentration and electric field strength in its pillar layers in correlation with position along the depth direction.

In FIG. 6, the detailed description of the same elements as those in FIG. 1 is omitted, and only different elements are described here.

As shown in FIG. 6, in the power MOSFET 102 according to this embodiment, the trench 21 is formed so as to enter the boundary portion between the n-pillar layer 3 and the p-pillar layer 4. Thus only one of the n-pillar layer 3 and the p-pillar layer 4 exists in each portion of the drift layer between the trenches 21. As compared with the first embodiment described above, the trench 21 is shallower, formed only halfway through the drift layer. Furthermore, the p-pillar layer 4 is not in contact with the $n^+$-drain layer 2, but the p-pillar layer 3 is interposed between the p-pillar layer 4 and the $n^+$-drain layer 2.

Moreover, the profile of sheet dopant concentration in the p-pillar layer 4 along the depth direction (p-pillar concentration) is uniform in the portion 4a between the buried field plate electrodes 11 and sharply varies at the position corresponding to the lower end of the buried field plate electrode 11. The p-pillar concentration in the portion directly below the portion 4a is higher than the p-pillar concentration in the portion 4a. In the portion 4b of the p-pillar layer 4 below the buried field plate electrode 11, the p-pillar concentration decreases as the depth increases. The p-pillar concentration is higher than the n-pillar concentration in the upper part of the portion 4b, and the p-pillar concentration is lower than the n-pillar concentration in the lower part of the portion 4b. The configuration in this embodiment other than the foregoing is the same as that in the first embodiment described above.

Next, the operation and effect of this embodiment are described.

In this embodiment, the p-pillar concentration in the portion 4a of the p-pillar layer 4 between the buried field plate electrodes 11 is constant along the depth direction. Hence the electric field strength in the portion 4a is highest at the upper end of the portion 4a, decreases as the depth increases, and is lowest at the lower end of the portion 4a, or the boundary with the portion 4b. It is noted that only one of the n-pillar layer 3 and the p-pillar layer 4 is formed between the trenches 21 in the drift layer. Hence, even if a difference exists between the n-pillar concentration and the p-pillar concentration, this difference does not affect the electric field distribution in the portion of the n-pillar layer 3 between the buried field plate electrodes 11.

On the other hand, in the portion 4b of the p-pillar layer 4 below the buried field plate electrode 11, the p-pillar concentration is higher than the n-pillar concentration in the upper part, and the n-pillar concentration is higher than the p-pillar concentration in the lower part. Hence the electric field strength in the portion 4b is high at the center of the portion 4b along the depth direction and lower at the upper and lower end than at the center. Thus the electric field peak shifts to a deeper position than in the trench 21, and electric field concentration at the lower end of the buried field plate electrode 11 is alleviated. Hence occurrence of avalanche breakdown in this portion can be prevented. Consequently, the power MOSFET 102 according to this embodiment can achieve high reliability.

In this embodiment, as compared with the first embodiment described above, the trench 21 is formed shallower, and the degree of electric field concentration at the lower end of the buried field plate electrode 11 is decreased accordingly. Hence the buried insulating film 10 can be thinned. The configuration, operation, and effect in this embodiment other than the foregoing are the same as those in the first embodiment described above.

Next, a variation of the second embodiment is described.

Figure 7:
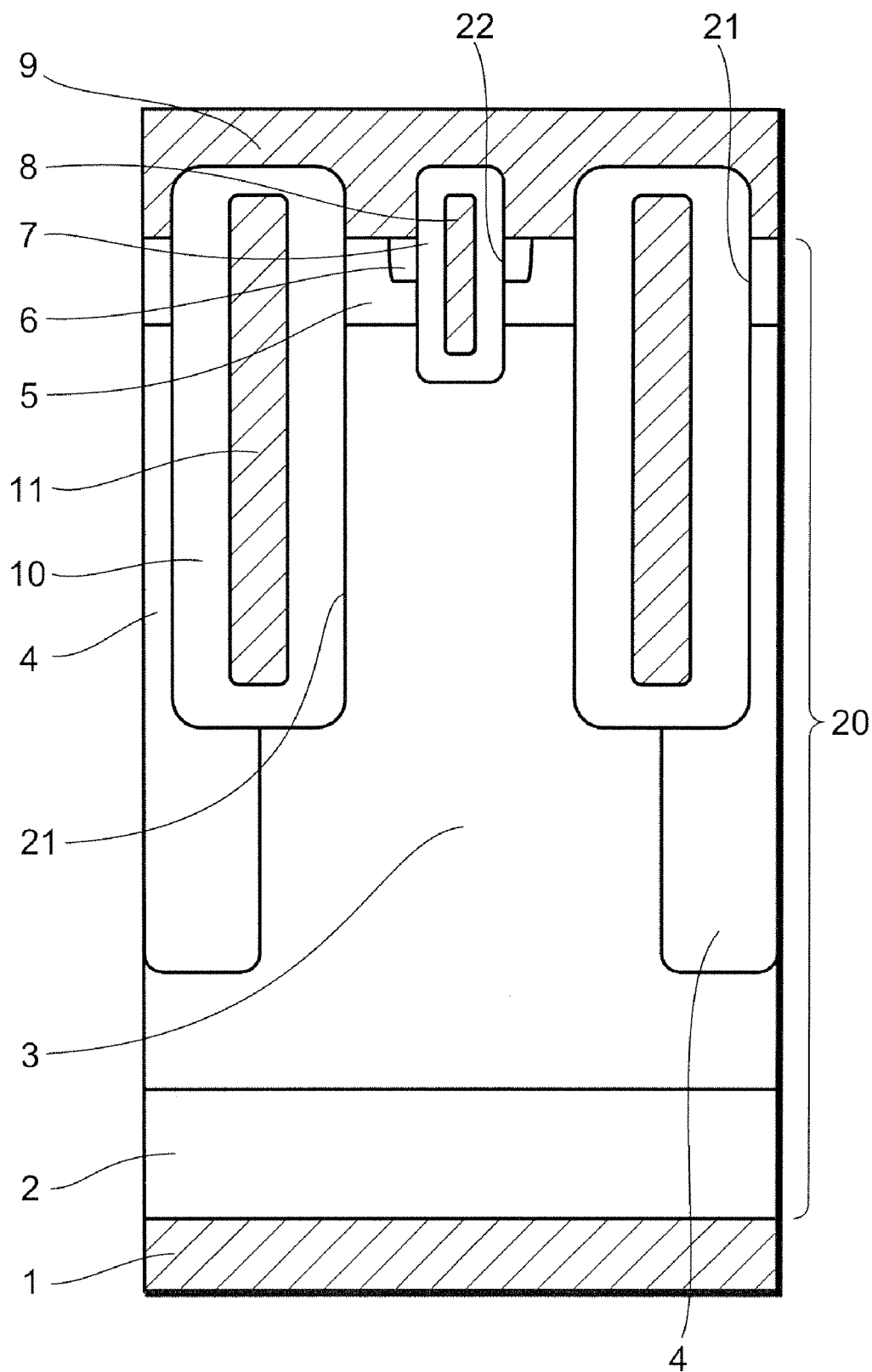
FIG. 7 is a cross-sectional view schematically illustrating a power MOSFET according to a variation of the second embodiment.

FIG. 7 is a cross-sectional view schematically illustrating a power MOSFET according to this variation.

As shown in FIG. 7, this variation is a combination of the fourth variation of the first embodiment and the second embodiment described above. More specifically, in this variation, in the region between the trenches 21 corresponding to the n-pillar layer 3, a trench 22 shallower than the trench 21 is formed. In the trench 21, only the buried insulating film 10 and the buried field plate electrode 11 are provided. In the trench 22, a gate insulating film 7 and a gate electrode 8 are provided. Thus the gate electrode 8 and the buried field plate electrode 11 are separately formed. The configuration, operation, and effect in this variation other than the foregoing are the same as those in the second embodiment described above.

THIRD EMBODIMENT

Figure 8:
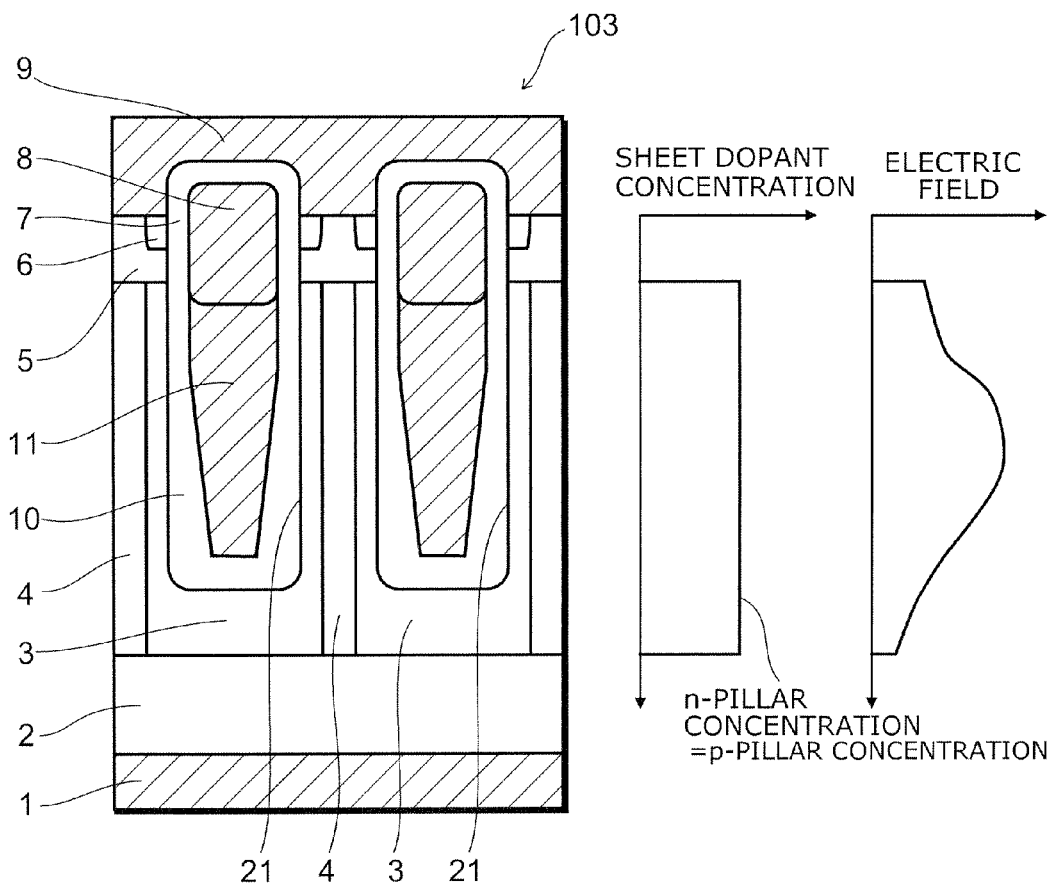
FIG. 8 is a cross-sectional view schematically illustrating a power MOSFET according to a third embodiment of the invention, and schematic graphs illustrating sheet dopant concentration and electric field strength in its pillar layers in correlation with position along the depth direction.

FIG. 8 shows a cross-sectional view schematically illustrating a power MOSFET according to a third embodiment of the invention, and schematic graphs illustrating sheet dopant concentration and electric field strength in its pillar layers in correlation with position along the depth direction.

In FIG. 8, the detailed description of the same elements as those in FIG. 1 is omitted, and only different elements are described here.

As shown in FIG. 8, in the power MOSFET 103 according to this embodiment, the width of the buried field plate electrode 11 varies along the depth direction in its lower portion, thinned downward. On the other hand, the width of the trench 21 is constant along the depth direction. Hence the thickness of the buried insulating film 10 varies along the depth direction, being constant and as thin as the gate insulating film 7 in the upper portion of the trench 21, but thickened downward in the lower portion thereof. The n-pillar concentration and the p-pillar concentration are constant along the depth direction.

Next, the operation and effect of this embodiment are described.

In this embodiment, the thickness of the buried insulating film 10 varies along the depth direction. By varying the thickness of the buried insulating film 10, the peak position of electric field strength can be varied. More specifically, if the buried insulating film 10 is thin, the peak of electric field strength shifts downward, or toward the bottom of the trench 21. On the other hand, if the buried insulating film 10 is thick, the peak of electric field strength shifts upward, or toward the p-base layer 5. In this embodiment, the buried insulating film 10 is thinned like the gate insulating film 7 in the vicinity of the p-base layer 5, and thickened from halfway toward the lower end of the buried field plate electrode 11. Thus an electric field distribution can be realized where the electric field strength reaches its peak in the vicinity of the center of the trench 21 along the depth direction. By such an electric field distribution, it is possible to achieve high avalanche withstand capability and high reliability while achieving low ON resistance as in the first embodiment described above. The configuration, operation, and effect in this embodiment other than the foregoing are the same as those in the first embodiment described above.

FOURTH EMBODIMENT

Figure 9:
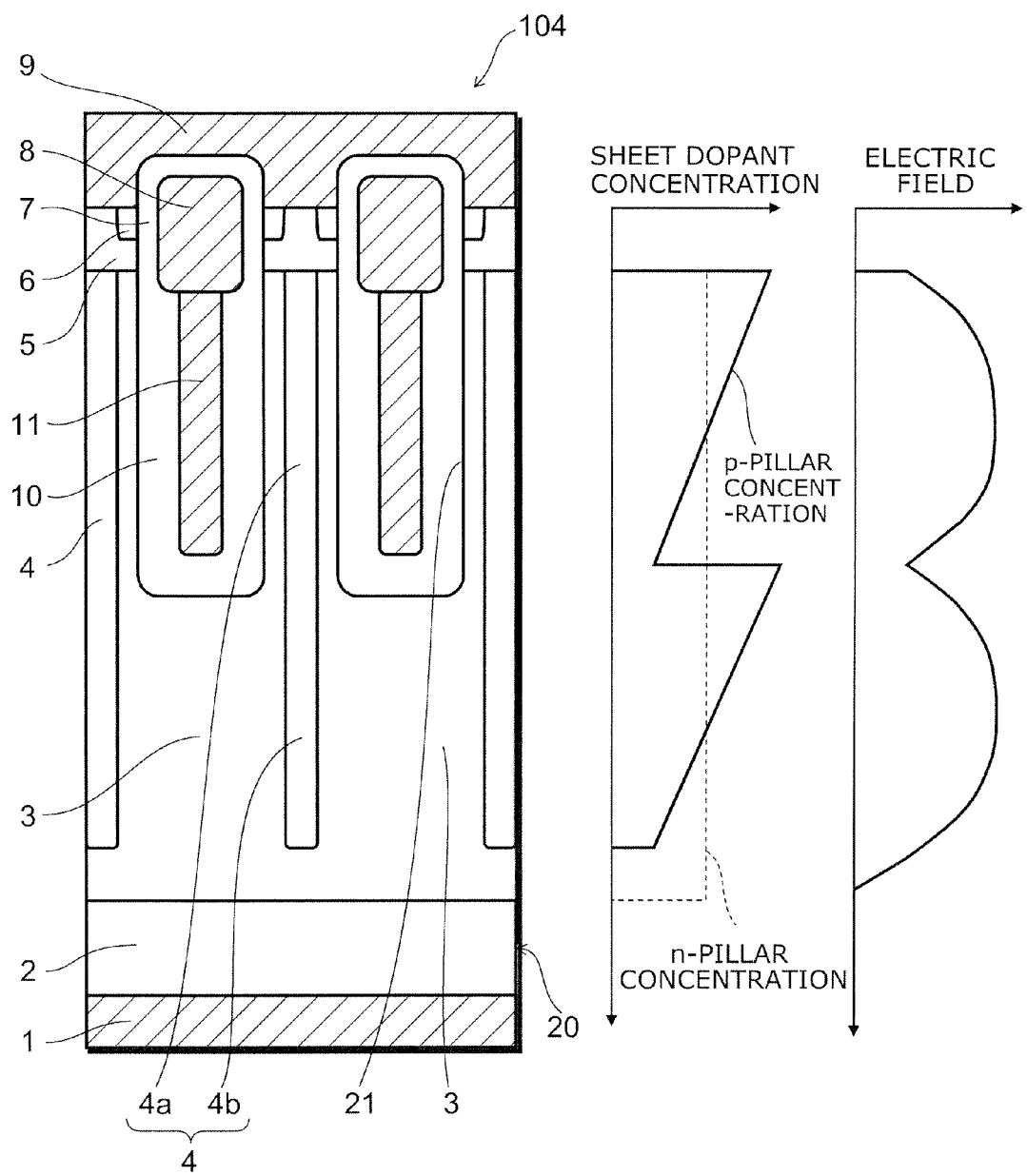
FIG. 9 is a cross-sectional view schematically illustrating a power MOSFET according to a fourth embodiment of the invention, and schematic graphs illustrating sheet dopant concentration and electric field strength in its pillar layers in correlation with position along the depth direction.

FIG. 9 shows a cross-sectional view schematically illustrating a power MOSFET according to a fourth embodiment of the invention, and schematic graphs illustrating sheet dopant concentration and electric field strength in its pillar layers in correlation with position along the depth direction.

In FIG. 9, the detailed description of the same elements as those in FIG. 1 is omitted, and only different elements are described here.

As shown in FIG. 9, the power MOSFET 104 according to this embodiment has shallower trenches 21 and thinner buried insulating films 10 than the power MOSFET 101 (see FIG. 1) according to the first embodiment described above. Furthermore, the portion 4b of the p-pillar layer 4 below the buried field plate electrode 11 also has a p-pillar concentration profile similar to that in the portion 4a between the buried field plate electrodes 11. More specifically, the p-pillar concentration in the portion 4b monotonically decreases downward from its upper end. The p-pillar concentration is higher than the n-pillar concentration in the upper part of the portion 4b, and the p-pillar concentration is lower than the n-pillar concentration in the lower part of the portion 4b. The configuration in this embodiment other than the foregoing is the same as that in the first embodiment described above.

Next, the operation and effect of this embodiment are described.

In the first embodiment described above, the electric field in the portion of the drift layer below the buried field plate electrode 11 is decreased for restraining the electric field at the bottom of the trench 21. Hence the holding voltage of this portion is low. To achieve high breakdown voltage throughout the device, the trench 21 needs to be formed deep, and the buried insulating film 10 needs to be formed thick.

In contrast, in this embodiment, as shown in FIG. 9, also in the portion 4b below the buried field plate electrode 11, the sheet dopant concentration in the p-pillar layer 4 (p-pillar concentration) has a distribution similar to that in the portion 4a between the buried field plate electrodes 11. Thus the electric field strength has a peak at the center of the portion 4b along the depth direction and is increased throughout the portion 4b. That is, the electric field distribution in the drift layer has a peak in each of the portion 4a and the portion 4b.

The holding voltage depends on the integrated value of electric field strength. Hence, by forming a peak of electric field strength in the portion 4b, the holding voltage in the portion 4b can be increased. Consequently, high breakdown voltage can be obtained even if the trench 21 is shallowed and the buried insulating film 10 is thinned. Furthermore, by positioning the peak of electric field strength at the center of the portion 4b along the depth direction, the electric field strength at the bottom of the trench 21 and near the n+-drain layer 2 can be kept low even if the electric field strength at the center of the portion 4b along the depth direction is increased. Hence these portions are less prone to avalanche breakdown. Consequently, high reliability and high avalanche withstand capability can be simultaneously achieved. The operation and effect in this variation other than the foregoing are the same as those in the first embodiment described above.

FIFTH EMBODIMENT

Figure 10:
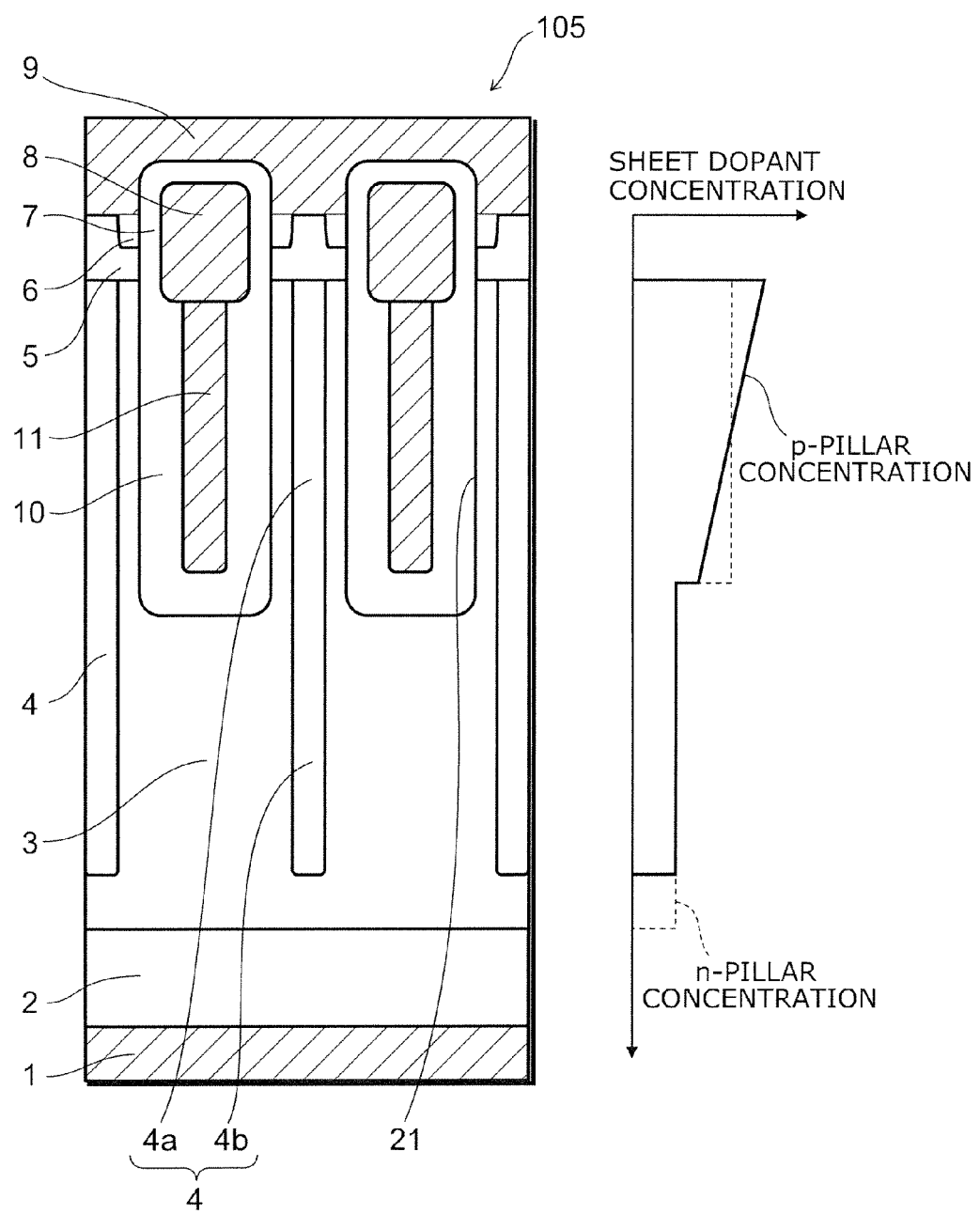
FIG. 10 is a cross-sectional view schematically illustrating a power MOSFET according to a fifth embodiment of the invention, and a schematic graph illustrating sheet dopant concentration in its pillar layers in correlation with position along the depth direction.

FIG. 10 shows a cross-sectional view schematically illustrating a power MOSFET according to a fifth embodiment of the invention, and a schematic graph illustrating sheet dopant concentration in its pillar layers in correlation with position along the depth direction.

In FIG. 10, the detailed description of the same elements as those in FIG. 1 is omitted, and only different elements are described here.

As shown in FIG. 10, in the power MOSFET 105 according to this embodiment, as compared with the power MOSFET 104 according to the fourth embodiment described above, the p-pillar concentration in the portion 4b of the p-pillar layer 4 below the buried field plate electrode 11 is lower than the p-pillar concentration in the portion 4a between the buried field plate electrodes 11, and uniform along the depth direction. Furthermore, the n-pillar concentration in the portion of the n-pillar layer 3 below the buried field plate electrode 11 is also lower than the n-pillar concentration in the portion between the buried field plate electrodes 11, and uniform. Hence the dopant concentration in the n-pillar layer 3 and the p-pillar layer 4 is relatively high in the portion of the drift layer between the trenches 21, and relatively low in the portion below the trench 21. In the portion below the buried field plate electrode 11, the p-pillar concentration is equal to the n-pillar concentration. The configuration in this embodiment other than the foregoing is the same as that in the fourth embodiment described above.

Next, the operation and effect of this embodiment are described.

When high voltage is applied between the source electrode 9 and the drain electrode 1 of the power MOSFET 105 according to this embodiment, in the upper portion of the drift layer, or in the portion between the buried field plate electrodes 11, the depletion layer extends not only from the pn junction interface between the n-pillar layer 3 and the p-pillar layer 4, but also from the interface between the buried insulating film 10 and the n-pillar layer 3. On the other hand, in the lower portion of the drift layer, or in the portion below the buried field plate electrode 11, the depletion layer extends only from the pn junction interface between the n-pillar layer 3 and the p-pillar layer 4. Thus, in the upper portion of the drift layer, an effect similar to narrowing the arrangement pitch of pillar layers can be achieved. Hence high breakdown voltage can be held even if the dopant concentration is increased. Thus the ON resistance can be decreased while a prescribed breakdown voltage is held. The operation and effect in this embodiment other than the foregoing are the same as those in the fourth embodiment described above.

Next, a first variation of the fifth embodiment is described.

Figure 11:
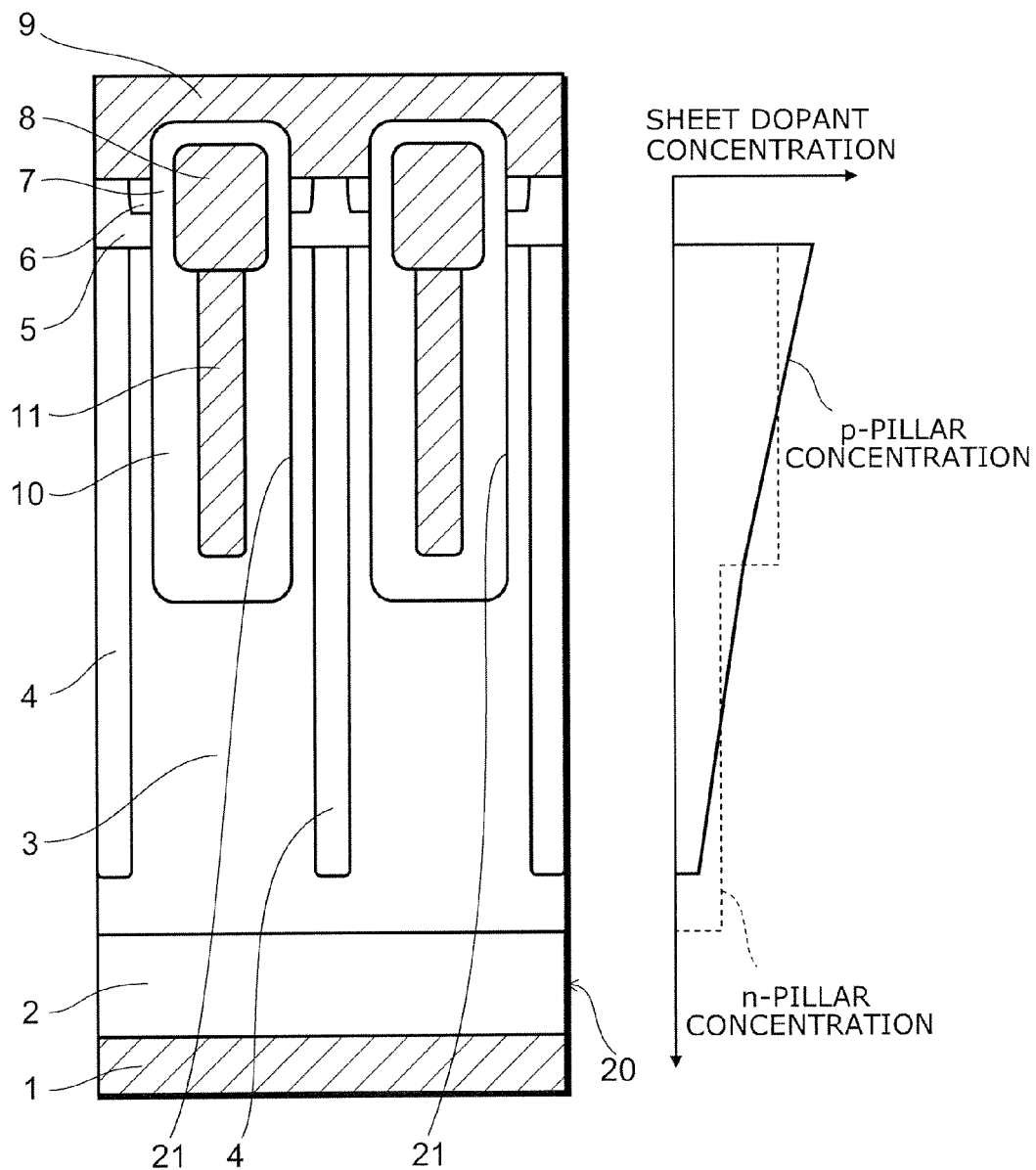
FIG. 11 is a cross-sectional view schematically illustrating a power MOSFET according to a first variation of the fifth embodiment, and a schematic graph illustrating sheet dopant concentration in its pillar layers in correlation with position along the depth direction.

FIG. 11 shows a cross-sectional view schematically illustrating a power MOSFET according to this variation, and a schematic graph illustrating sheet dopant concentration in its pillar layers in correlation with position along the depth direction.

As shown in FIG. 11, in this variation, the p-pillar concentration varies continuously and monotonically over the entire length along the depth direction, decreasing downward. On the other hand, as in the fifth embodiment described above, the profile of the n-pillar concentration has a two-step configuration, high in the upper portion and low in the lower portion, and uniform along the depth direction in each step.

Thus, also in the lower portion of the drift layer, the p-pillar concentration is higher than the n-pillar concentration in the relatively upper part, and the n-pillar concentration is higher than the p-pillar concentration in the relatively lower part. Hence a peak of electric field strength can be formed at the center of the lower portion of the drift layer along the depth direction, and thus the holding voltage can be increased. Consequently, high breakdown voltage can be achieved throughout the drift layer. The configuration, operation, and effect in this variation other than the foregoing are the same as those in the fifth embodiment described above.

Next, a second variation of the fifth embodiment is described.

Figure 12:
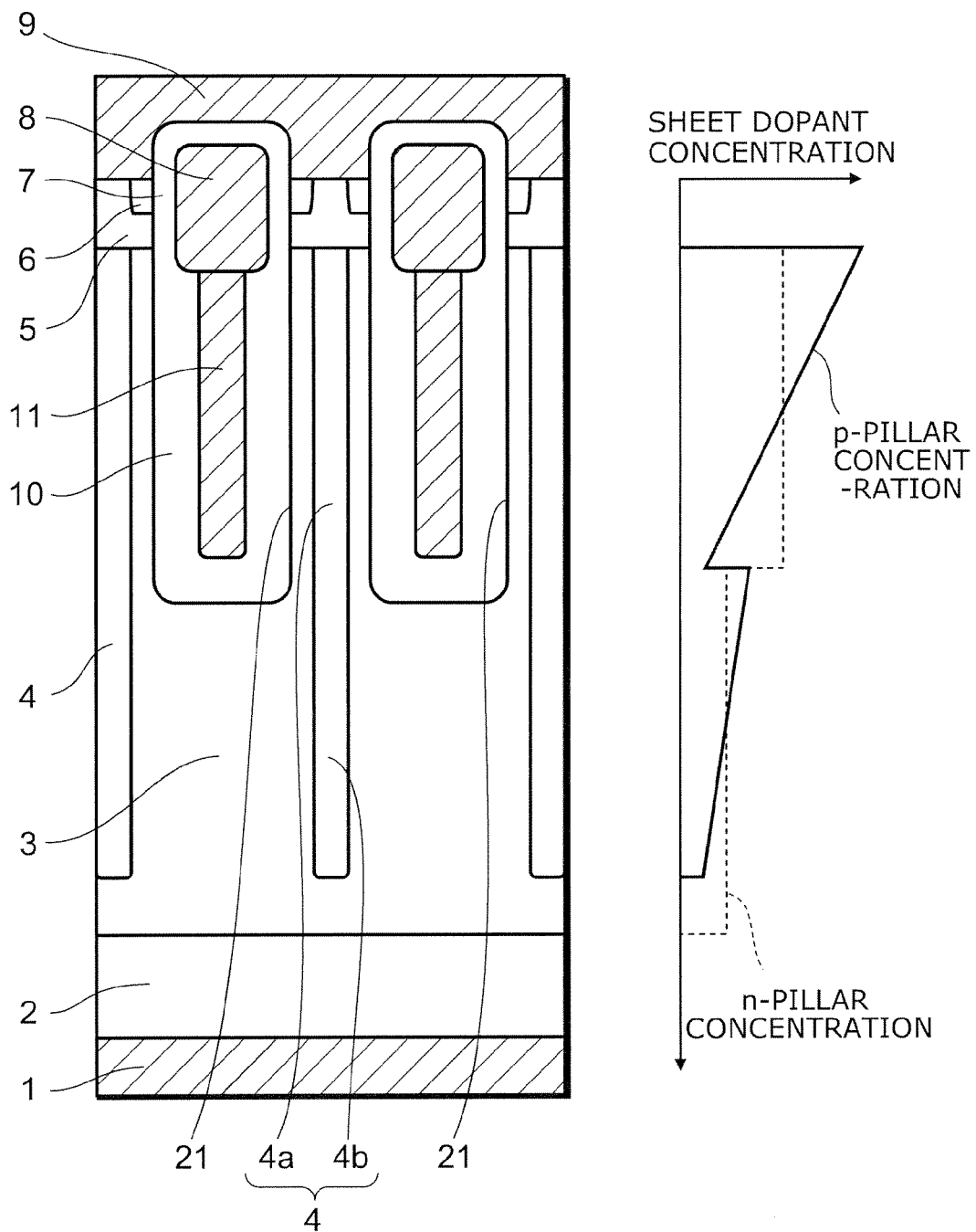
FIG. 12 is a cross-sectional view schematically illustrating a power MOSFET according to a second variation of the fifth embodiment, and a schematic graph illustrating sheet dopant concentration in its pillar layers in correlation with position along the depth direction.

FIG. 12 shows a cross-sectional view schematically illustrating a power MOSFET according to this variation, and a schematic graph illustrating sheet dopant concentration in its pillar layers in correlation with position along the depth direction.

As shown in FIG. 12, in this variation, the p-pillar concentration significantly varies at the boundary between the portion 4a and the portion 4b of the p-pillar layer 4. The average of the p-pillar concentration in the portion 4b is lower than the average in the portion 4a, and the slope of the p-pillar concentration in the portion 4b is smaller than the slope in the portion 4a. On the other hand, as in the fifth embodiment and its first variation described above, the profile of the n-pillar concentration has a two-step configuration. The configuration in this variation other than the foregoing is the same as that in the fifth embodiment described above.

In a structure like the power MOSFET 105 according to the fifth embodiment where the buried field plate electrode 11 is buried only in the upper portion of the drift layer, depletion is more difficult in the lower portion of the drift layer than in the upper portion thereof. Hence, in this variation, the slope of the p-pillar concentration in the portion 4b of the p-pillar layer 4 is made smaller than the slope in the portion 4a. Thus the difference between the p-pillar concentration and the n-pillar concentration in the lower portion of the drift layer is decreased to facilitate depletion. Hence the holding voltage in the lower portion of the drift layer can be further increased. The operation and effect in this variation other than the foregoing are the same as those in the fifth embodiment described above.

SIXTH EMBODIMENT

Figure 13:
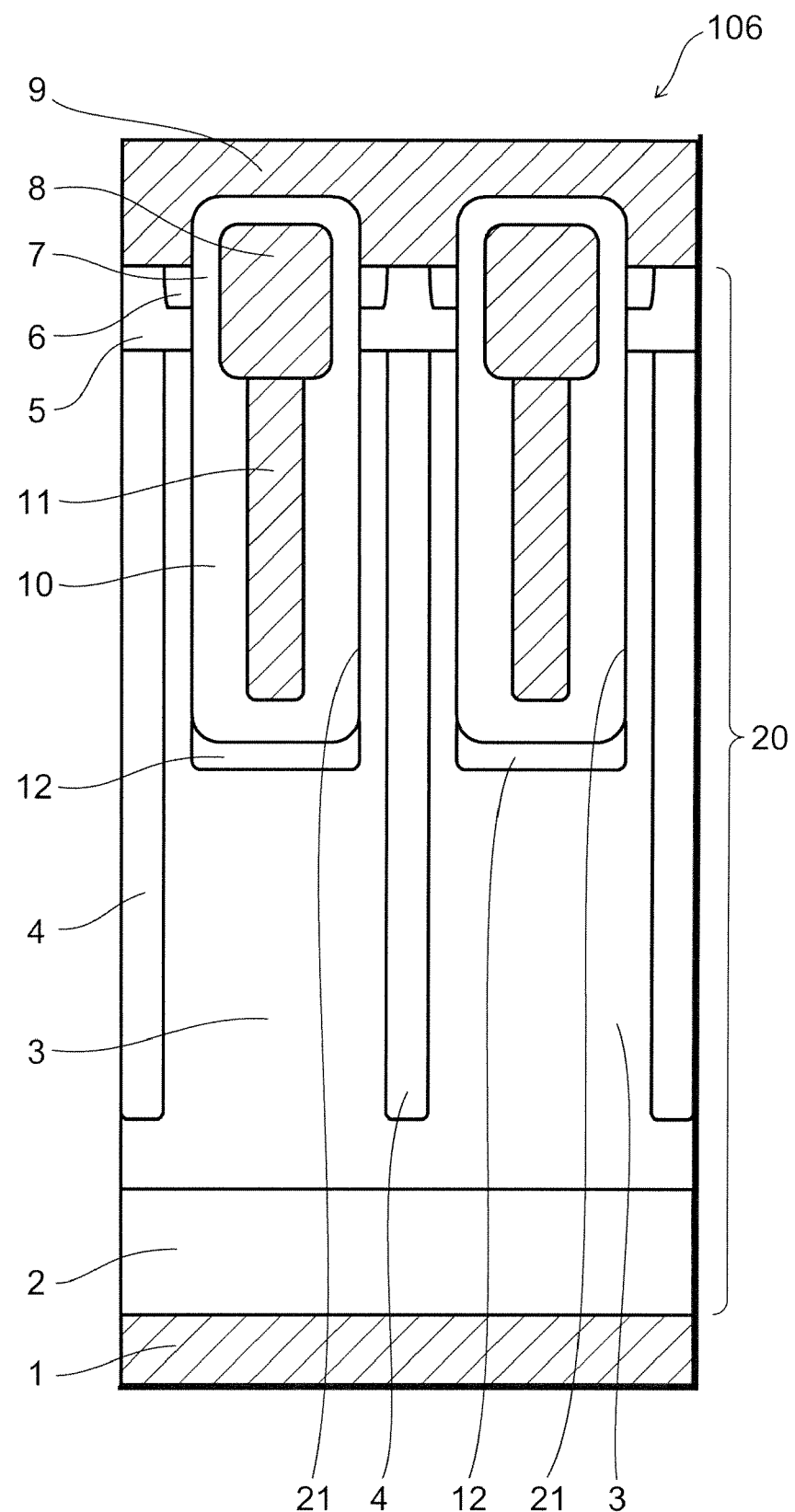
FIG. 13 is a cross-sectional view schematically illustrating a power MOSFET according to a sixth embodiment of the invention.

FIG. 13 is a cross-sectional view schematically illustrating a power MOSFET according to a sixth embodiment of the invention.

In FIG. 13, the detailed description of the same elements as those in FIG. 1 is omitted, and only different elements are described here.

As shown in FIG. 13, in the power MOSFET 106 according to this embodiment, a buried p-layer 12 is formed at the bottom of the trench 21. The buried p-layer 12 is doped with p-type dopant, and its concentration is higher than the dopant concentration in the p-pillar layer 4. Furthermore, the buried p-layer 12 is connected to the p-pillar layer 4 in a portion not shown. The configuration in this embodiment other than the foregoing is the same as that in the fourth embodiment described above.

In this embodiment, the buried p-layer 12 acts as a shield, ensuring that the electric field applied to the bottom of the trench 21 can be decreased. Hence the degradation of the buried insulating film 10 can be prevented. Furthermore, when the power MOSFET 106 is turned into the OFF state, high voltage is applied also to the drift layer, and hence the buried p-layer 12 is also depleted. When the power MOSFET 106 is then turned into the ON state, holes are injected into the buried p-layer 12, and the depletion layer vanishes. That is, along with the switching of the power MOSFET 106, the buried p-layer 12 is charged and discharged with holes. In this embodiment, this charging/discharging with holes can be rapidly performed because the buried p-layer 12 is connected to the p-pillar layer 4. Hence, even if the driving frequency of the power MOSFET 106 is increased, it is possible to prevent the increase of ON resistance during the ON state due to the depletion layer remaining in the buried p-layer 12. The operation and effect in this embodiment other than the foregoing are the same as those in the fourth embodiment described above.

Preferably, the concentration in the buried p-layer 12 is determined so that it is completely depleted during the OFF state. Then voltage is applied to both the buried p-layer 12 and the buried insulating film 10, and the voltage applied to the buried insulating film 10 can be decreased. Consequently, the degradation of the buried insulating film 10 can be prevented more effectively.

SEVENTH EMBODIMENT

Figure 14:
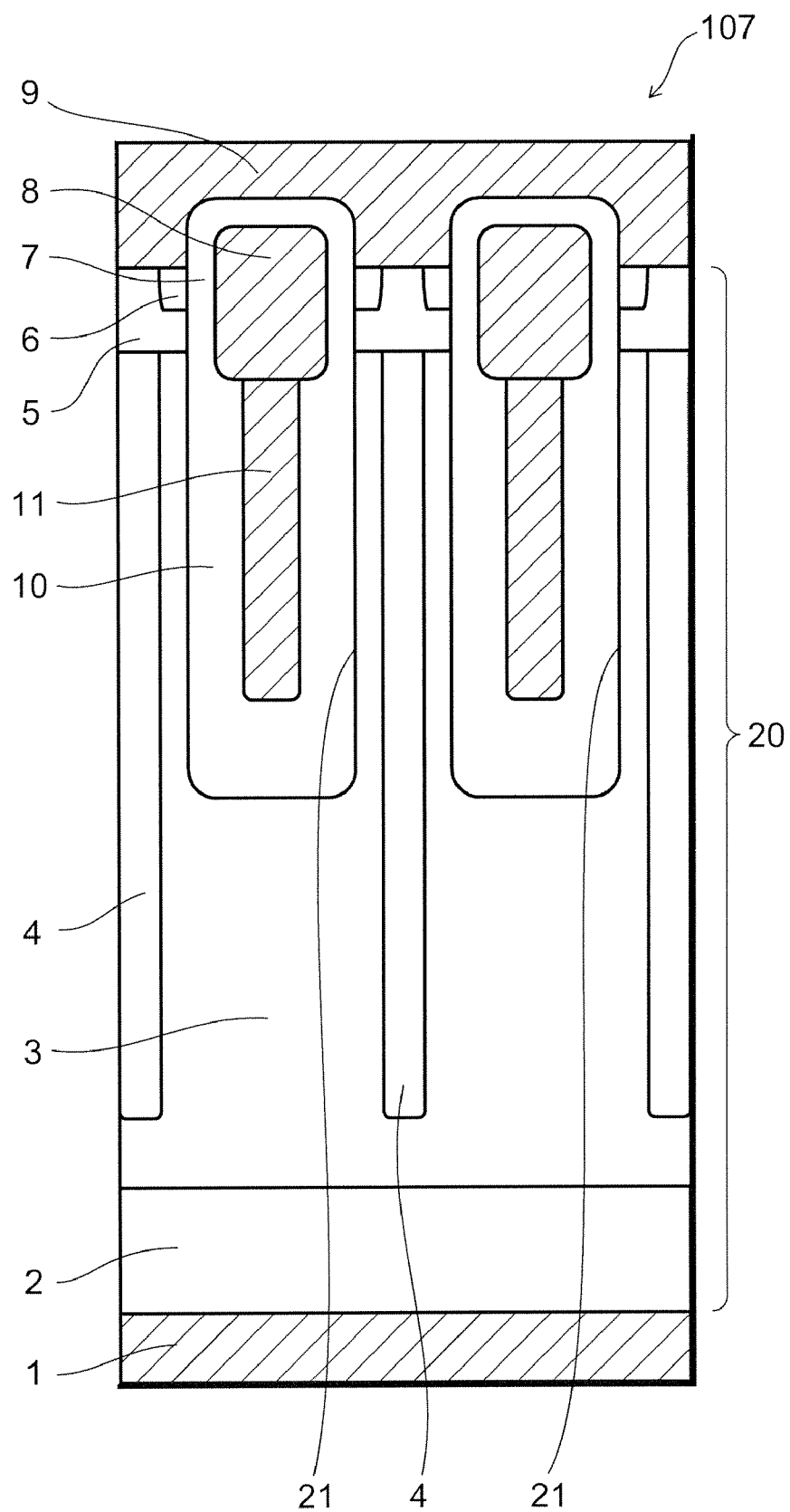
FIG. 14 is a cross-sectional view schematically illustrating a power MOSFET according to a seventh embodiment of the invention.

FIG. 14 is a cross-sectional view schematically illustrating a power MOSFET according to a seventh embodiment of the invention.

As shown in FIG. 14, in the power MOSFET 107 according to this embodiment, the portion of the buried insulating film 10 located above the bottom of the trench 21 is thicker than the portion located on the side face of the trench 21. Hence the electric field concentration at the bottom of the trench 21 can be restrained more effectively. The configuration, operation, and effect in this embodiment other than the foregoing are the same as those in the fourth embodiment described above.

In the sixth and seventh embodiment described above, the profile of the n-pillar concentration and the p-pillar concentration may be configured as in the fifth embodiment (see FIG. 10), its first variation (see FIG. 11), or its second variation (see FIG. 12) described above. This can provide an even lower ON resistance and higher breakdown voltage. Furthermore, the sixth embodiment and the seventh embodiment can be practiced in combination. Then the effect of alleviating the electric field at the bottom of the trench 21 by optimizing the profile of the sheet dopant concentration in the drift layer is combined with the effect of alleviating electric field by forming the buried p-layer 12 at the bottom of the trench 21 and the effect of alleviating electric field by thickening the buried insulating film 10 at the bottom of the trench 21. Thus a significant alleviation of electric field at the bottom of the trench 21 can be expected.

EIGHTH EMBODIMENT

Figure 15:
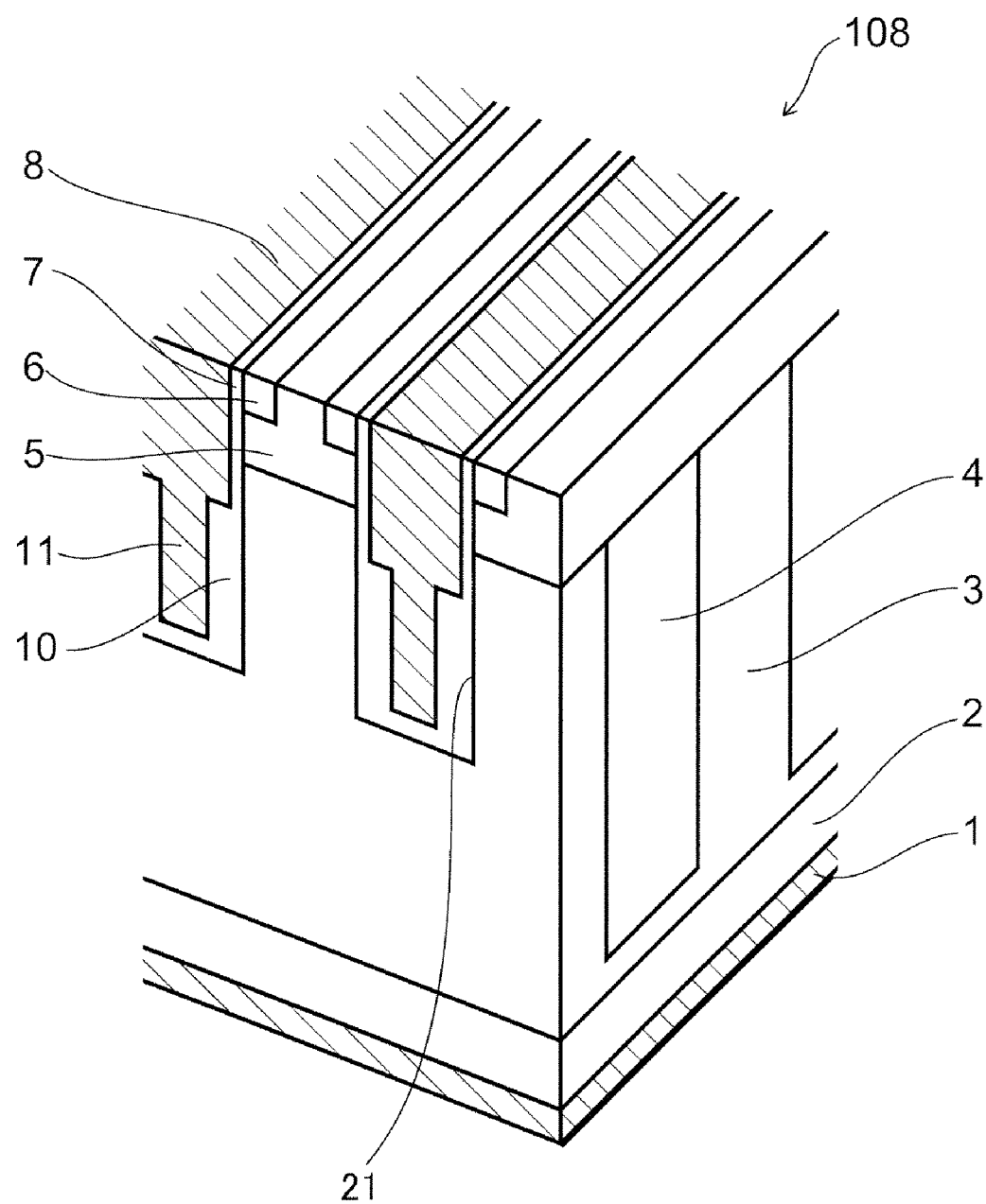
FIG. 15 is a perspective cross-sectional view schematically illustrating a power MOSFET according to an eighth embodiment of the invention.

FIG. 15 is a perspective cross-sectional view schematically illustrating a power MOSFET according to an eighth embodiment of the invention.

In FIG. 15, the detailed description of the same elements as those in FIG. 1 is omitted, and only different elements are described here.

As shown in FIG. 15, in the power MOSFET 108 according to this embodiment, as viewed from above, the extending direction of the n-pillar layer 3 and the p-pillar layer 4 is orthogonal to the extending direction of the trench 21, the gate electrode 8, and the buried field plate electrode 11. The configuration in this embodiment other than the foregoing is the same as that in the fourth embodiment described above.

In this embodiment, the extending direction of the n-pillar layer 3 is orthogonal to the extending direction of the trench 21. Hence, even if the width of the trench 21 varies due to processing variations and the like, the width of the n-pillar layer 3 is free from variations. Therefore the sheet dopant concentration is free from variations due to the variations in the width of the n-pillar layer 3, and the electric field distribution is free from variations due to the variations in sheet dopant concentration. Hence the breakdown voltage of the power MOSFET 108 is free from variations. That is, according to this embodiment, variations in the width of the trench 21, if any, only affect the area of the pn junction interface constituting the super junction structure, leaving the breakdown voltage constant. The operation and effect in this embodiment other than the foregoing are the same as those in the fourth embodiment described above.

Next, a first variation of the eighth embodiment is described.

Figure 16:
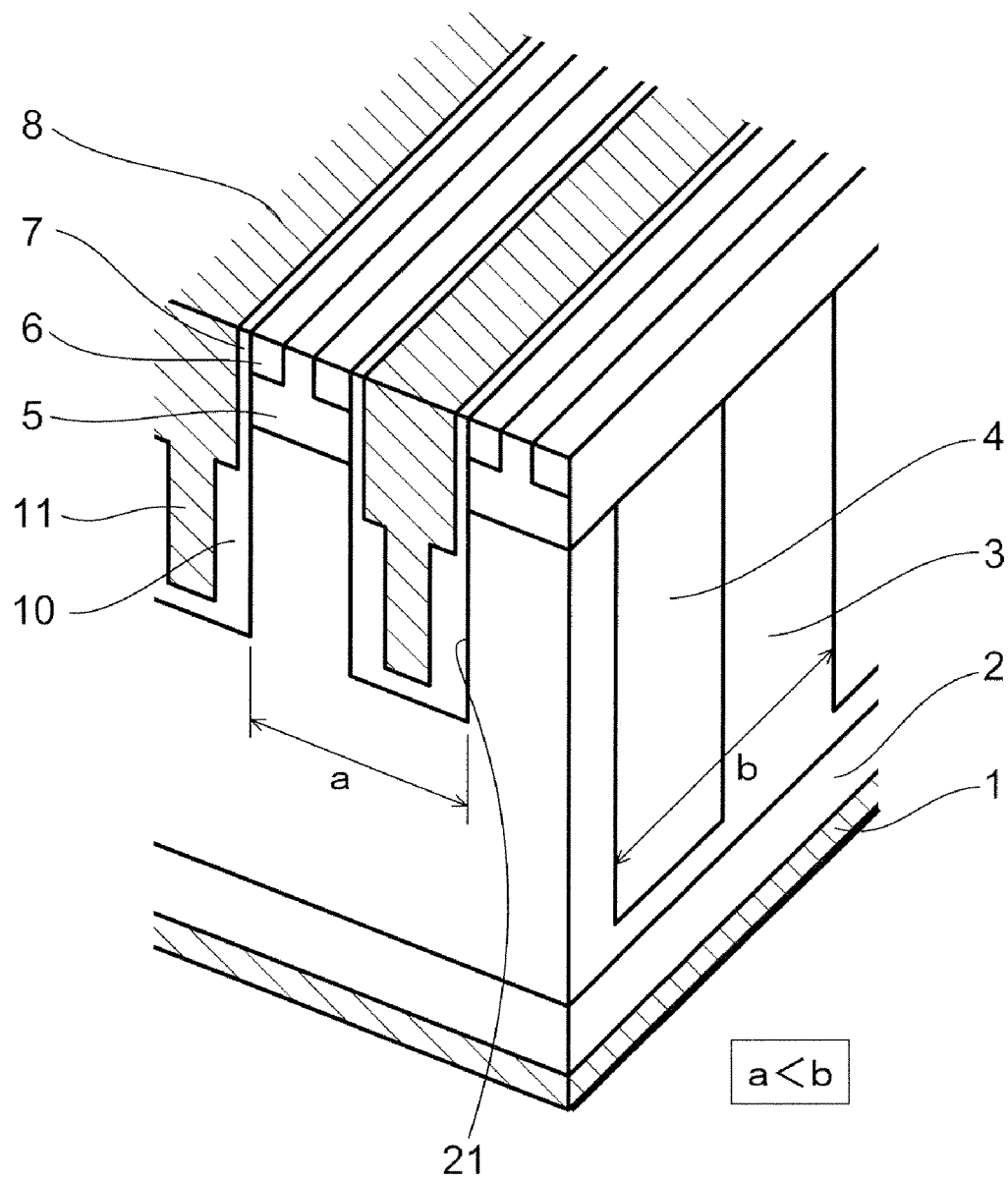
FIG. 16 is a perspective cross-sectional view schematically illustrating a power MOSFET according to a first variation of the eighth embodiment.

FIG. 16 is a perspective cross-sectional view schematically illustrating a power MOSFET according to this variation.

In the power MOSFET 108 according to the eighth embodiment described above, the extending direction of the n-pillar layer 3 and the p-pillar layer 4 is orthogonal to the extending direction of the trench 21, the gate electrode 8, and the buried field plate electrode 11. Hence the arrangement pitch of the buried field plate electrodes 11 and the formation pitch of the super junction structure can be independently configured. Thus, in this variation, as shown in FIG. 16, the arrangement pitch a of the buried field plate electrodes 11 is made smaller than the formation pitch b of the super junction structure, that is, a<b.

It is difficult to decrease the formation pitch b of the super junction structure because it complicates the process for forming the super junction structure. In contrast, the arrangement pitch a of the buried field plate electrodes 11 can be easily decreased simply by changing the etching pattern. Furthermore, decreasing the arrangement pitch a of the buried field plate electrodes 11 facilitates depletion of the upper portion of the drift layer. Hence the pillar concentration can be increased, and the ON resistance can be decreased. Thus, in this variation, by setting a<b, the ON resistance of the power MOSFET can be decreased. The configuration, operation, and effect in this variation other than the foregoing are the same as those in the eighth embodiment described above.

Next, a second variation of the eighth embodiment is described.

Figure 17:
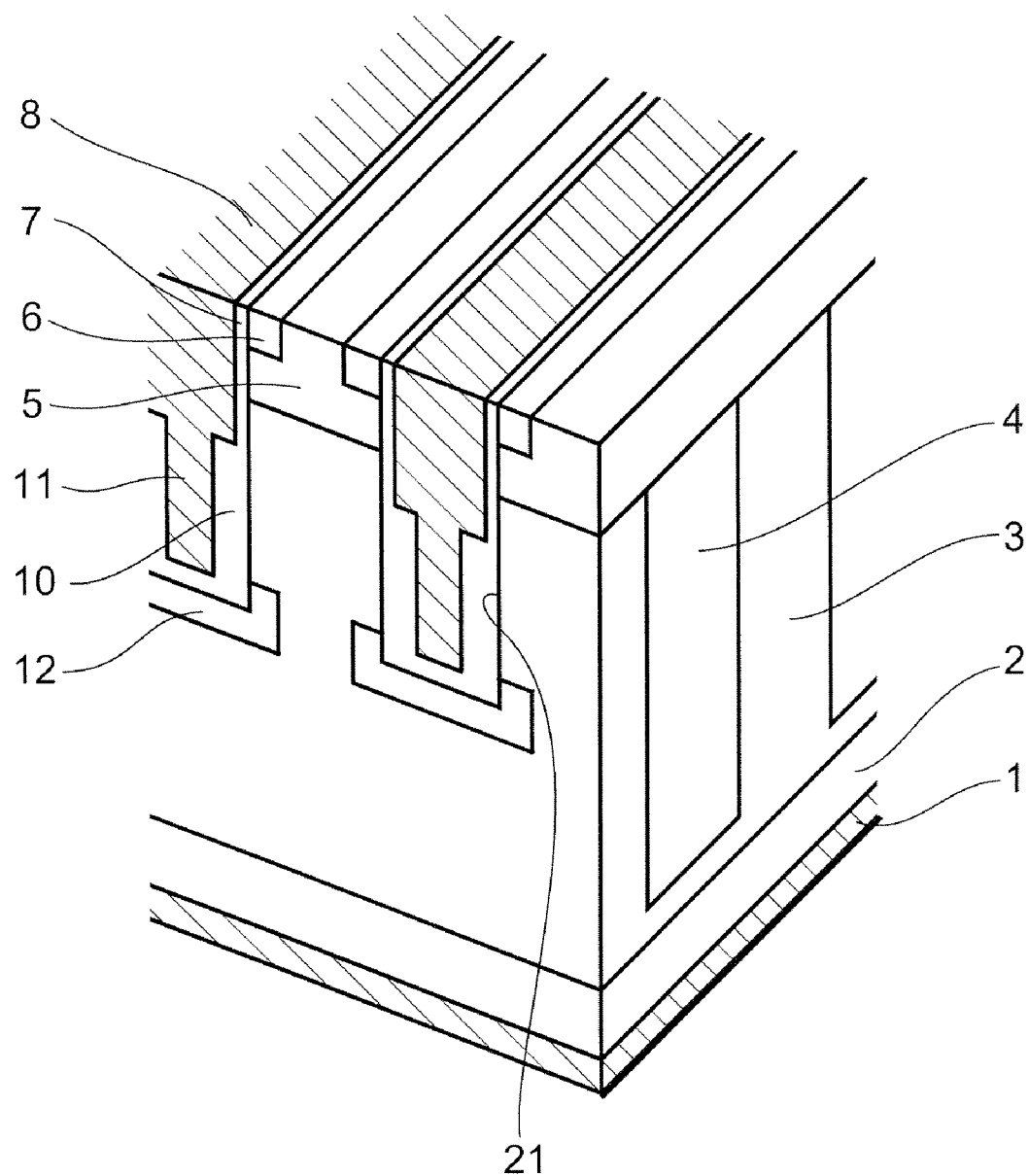
FIG. 17 is a perspective cross-sectional view schematically illustrating a power MOSFET according to a second variation of the eighth embodiment.

FIG. 17 is a perspective cross-sectional view schematically illustrating a power MOSFET according to this variation.

As shown in FIG. 17, in this variation, a buried p-layer 12 is formed at the bottom of the trench 21. Thus the voltage applied to the buried insulating film 10 formed at the bottom of the trench 21 can be decreased. Furthermore, in this variation, the buried p-layer 12 is orthogonally connected to the p-pillar layer 4. Hence charging/discharging with holes at the time of switching is rapidly performed. Preferably, the buried p-layer 12 is completely depleted during application of high voltage so that voltage can be held also by the buried p-layer 12. The configuration, operation, and effect in this embodiment other than the foregoing are the same as those in the eighth embodiment described above.

NINTH EMBODIMENT

Figure 18:
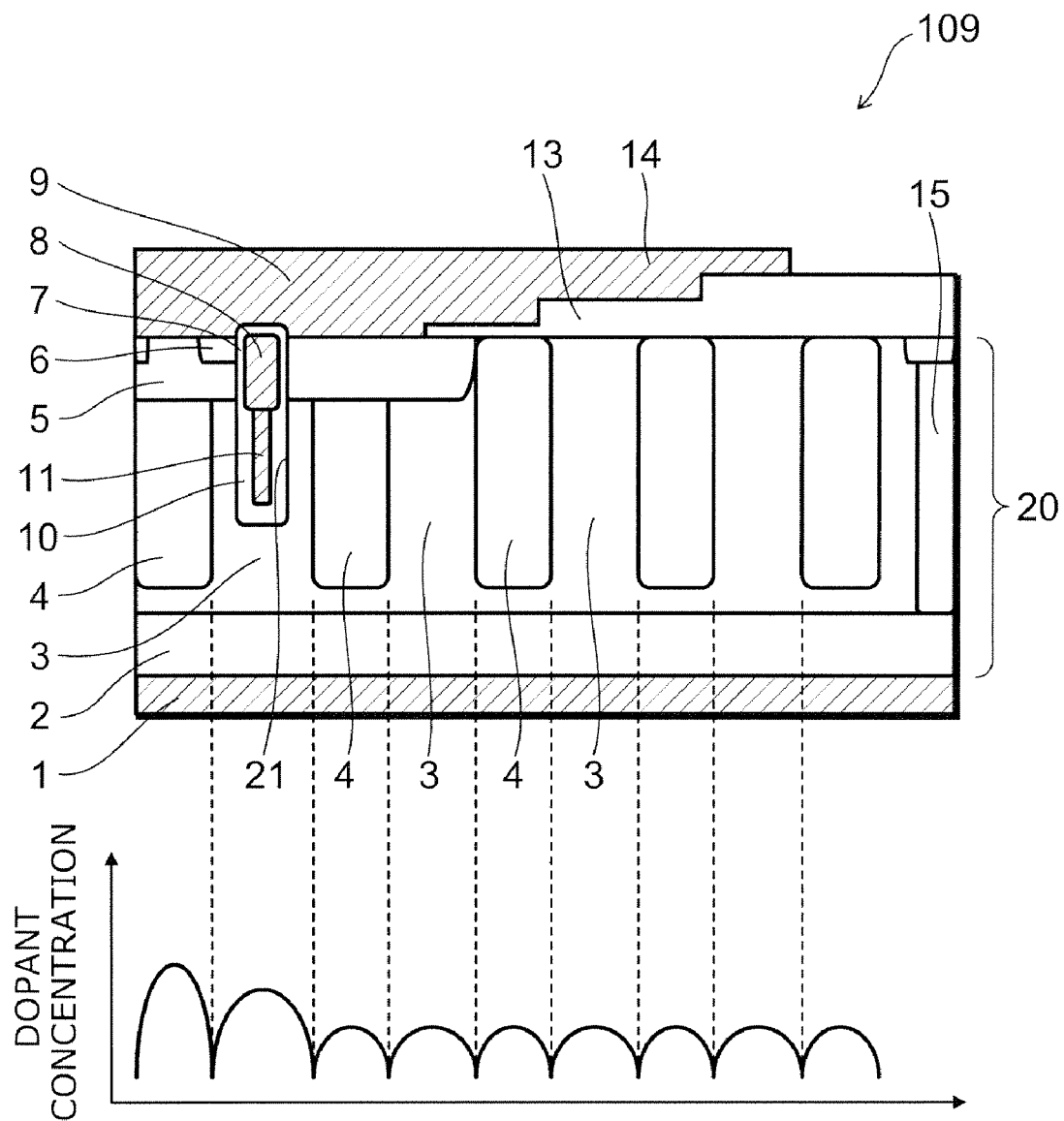
FIG. 18 is a cross-sectional view schematically illustrating a power MOSFET according to a ninth embodiment of the invention, and a schematic graph illustrating dopant concentration in its pillar layers in correlation with position along the arranging direction.

FIG. 18 shows a cross-sectional view schematically illustrating a power MOSFET according to a ninth embodiment of the invention, and a schematic graph illustrating dopant concentration in its pillar layers in correlation with position along the arranging direction.

It is noted that FIG. 18 shows not only the main cell region having a MOS gate, but also the termination region. The detailed description of the same elements as those in FIG. 1 is omitted, and only different elements are described here.

As shown in FIG. 18, this embodiment includes an improved configuration of the termination region in addition to the first embodiment described above. The power MOSFET 109 according to this embodiment includes a super junction structure composed of n-pillar layers 3 and p-pillar layers 4 not only in the main cell region but also in the termination region. However, the buried field plate electrode 11 is provided only in the main cell region and not provided in the termination region. The dopant concentration in the n-pillar layer 3 and the p-pillar layer 4 is relatively high in the main cell region, and relatively low in the termination region. Furthermore, in the termination region, a field insulating film 13 is formed on the semiconductor substrate 20. A field plate electrode 14 integrally formed with the source electrode 9 climbs up the field insulating film 13 from the main cell region side. The interface between the field insulating film 13 and the field plate electrode 14 is configured like a staircase, ascending with the distance from the main cell region. Moreover, on the end face of the semiconductor substrate 20, or dicing line, a field stop layer 15 is formed throughout the end face. The configuration in this embodiment other than the foregoing, or the configuration of the main cell region, is the same as that in the first embodiment described above.

Next, the operation and effect of this embodiment are described.

In a power MOSFET, high voltage is applied not only to the main cell region but also to the termination region. Hence the depletion layer needs to be extended also to the termination region for holding high voltage in the termination region as well. Thus, in this embodiment, the following measures are taken to extend the depletion layer to the termination region.

In the main cell region, by forming a buried field plate electrode 11, the depletion layer is extended to hold high voltage. On the other hand, in the termination region, providing a buried field plate electrode 11 entails providing a buried insulating film 10. However, the motion of electrons and holes is then hampered by the buried insulating film 10, and the depletion layer becomes difficult to extend. Hence, in this embodiment, in the termination region, no trench 21 is formed, and the buried insulating film 10 and the buried field plate electrode 11 are not provided.

By thus omitting the buried field plate electrode 11 in the termination region, the depletion layer is more difficult to extend in the termination region than in the main cell region. Hence, in this embodiment, the dopant concentration in the n-pillar layer and the p-pillar layer is made lower in the termination region than in the main cell region so that the depletion layer easily extends, thereby holding high breakdown voltage.

Furthermore, a field insulating film 13 is provided on the semiconductor substrate 20 in the termination region, and a field plate electrode 14 is provided on the field insulating film 13, so that the depletion layer rapidly extends to the termination region. On the other hand, by forming a field stop layer 15, the depletion layer is prevented from reaching the dicing line. By these configurations, the depletion layer is reliably extended into the termination region without being brought into contact with the dicing line, thereby ensuring sufficient breakdown voltage in the termination region. The operation and effect in this embodiment other than the foregoing are the same as those in the first embodiment described above.

In this embodiment, a field stop electrode (not shown) connected to the field stop layer 15 may be provided on the semiconductor substrate 20. While the field plate electrode 14 is illustratively connected to the source electrode 9 in this embodiment, it is also practicable to connect the field plate electrode 14 to the gate electrode 8.

Next, a variation of the ninth embodiment is described.

Figure 19:
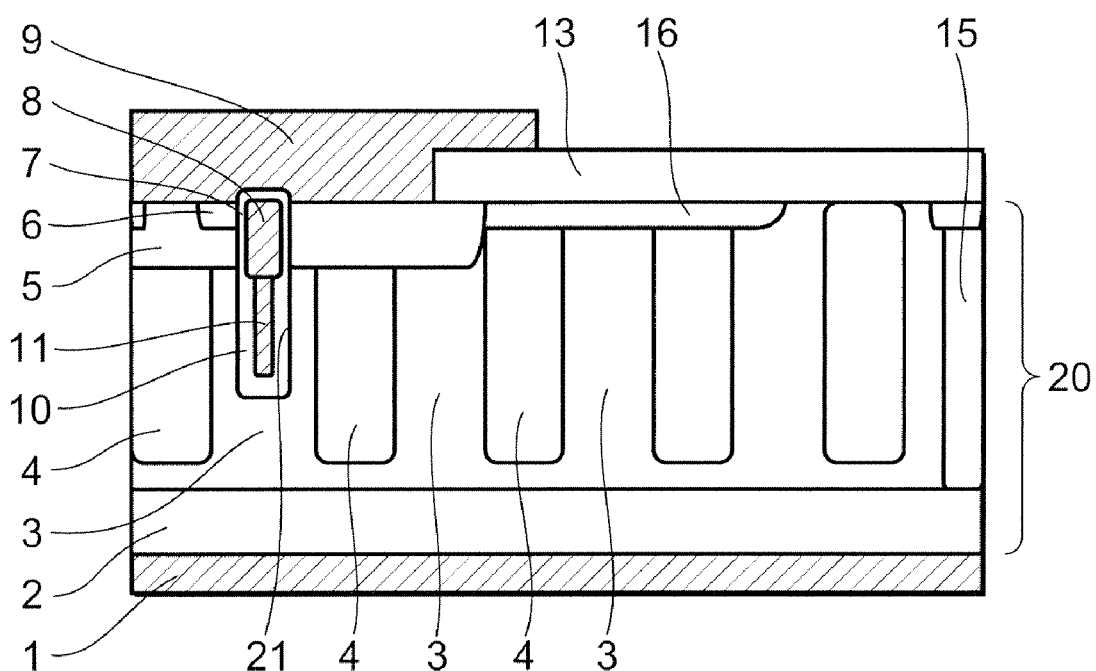
FIG. 19 is a cross-sectional view schematically illustrating a power MOSFET according to a variation of the ninth embodiment.

FIG. 19 is a cross-sectional view schematically illustrating a power MOSFET according to this variation.

As shown in FIG. 19, this variation has a RESURF layer 16 instead of the field plate electrode 14 (see FIG. 18) in the termination region. The RESURF layer 16 is illustratively a region doped with p-type dopant, formed in the upper surface of the semiconductor substrate 20, and being in contact with the p-base layer 5. Such a RESURF layer can also ensure sufficient breakdown voltage in the termination region. The configuration, operation, and effect in this variation other than the foregoing are the same as those in the ninth embodiment described above.

TENTH EMBODIMENT

Figure 20:
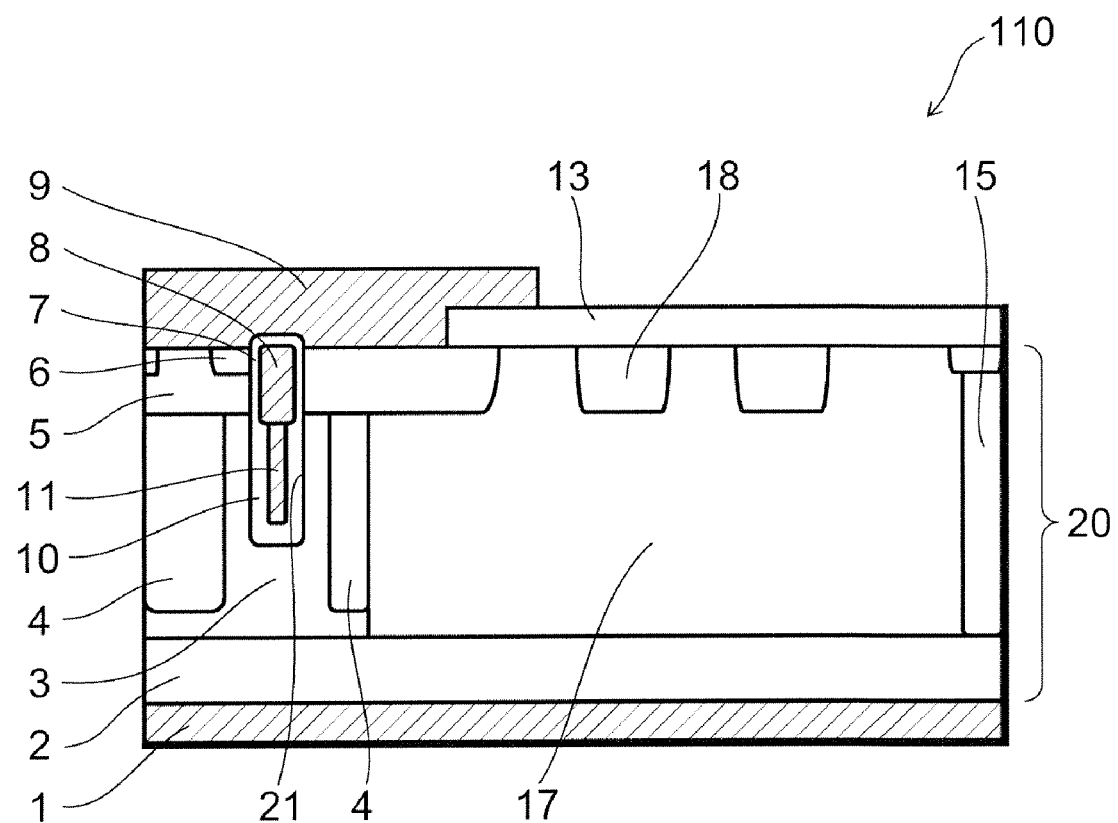
FIG. 20 is a cross-sectional view schematically illustrating a power MOSFET according to a tenth embodiment of the invention.

FIG. 20 is a cross-sectional view schematically illustrating a power MOSFET according to a tenth embodiment of the invention.

It is noted that FIG. 20 shows not only the main cell region having a MOS gate, but also the termination region. The detailed description of the same elements as those in FIG. 1 is omitted, and only different elements are described here.

As shown in FIG. 20, in the termination region of the power MOSFET 110 according to this embodiment, the super junction structure is not formed, but an n$^-$-layer 17 is formed instead. The dopant concentration in the n$^-$-layer 17 is illustratively ⅟10 or less of the dopant concentration in the n-pillar layer 3. The sheet dopant concentration in the p-pillar layer 4 located outermost in the drift layer, or the p-pillar layer 4 being in contact with the n$^-$-layer 17, is half the sheet dopant concentration in the other p-pillar layers 4. Furthermore, in the termination region, one or more guard ring layers 18 are formed in the upper surface of the semiconductor substrate 20, and a field insulating film 13 is provided on the semiconductor substrate 20. Moreover, on the end face of the semiconductor substrate 20, or dicing line, a field stop layer 15 is formed throughout the end face. The configuration in this embodiment other than the foregoing is the same as that in the first embodiment described above.

Next, the operation and effect of this embodiment are described.

In the power MOSFET 110, the drift layer is formed only in the main cell region. The sheet dopant concentration in the outermost p-pillar layer 4 of the drift layer is half that in the other p-pillar layers 4. In the termination region, an n$^-$-layer 17 having lower dopant concentration than the drift layer is formed. Hence the depletion layer extending from the buried field plate electrode 11 side easily reaches the termination region, increasing the breakdown voltage of the termination region.

Furthermore, by forming a guard ring layer 18 in the upper surface of the semiconductor substrate 20 in the termination region, the depletion layer can be rapidly extended to the termination region. On the other hand, by forming a field stop layer 15, the depletion layer is prevented from reaching the dicing line. By these configurations, the depletion layer is reliably extended into the termination region without being brought into contact with the dicing line, thereby ensuring sufficient breakdown voltage in the termination region. The operation and effect in this embodiment other than the foregoing are the same as those in the first embodiment described above.

Next, a first variation of the tenth embodiment is described.

Figure 21:
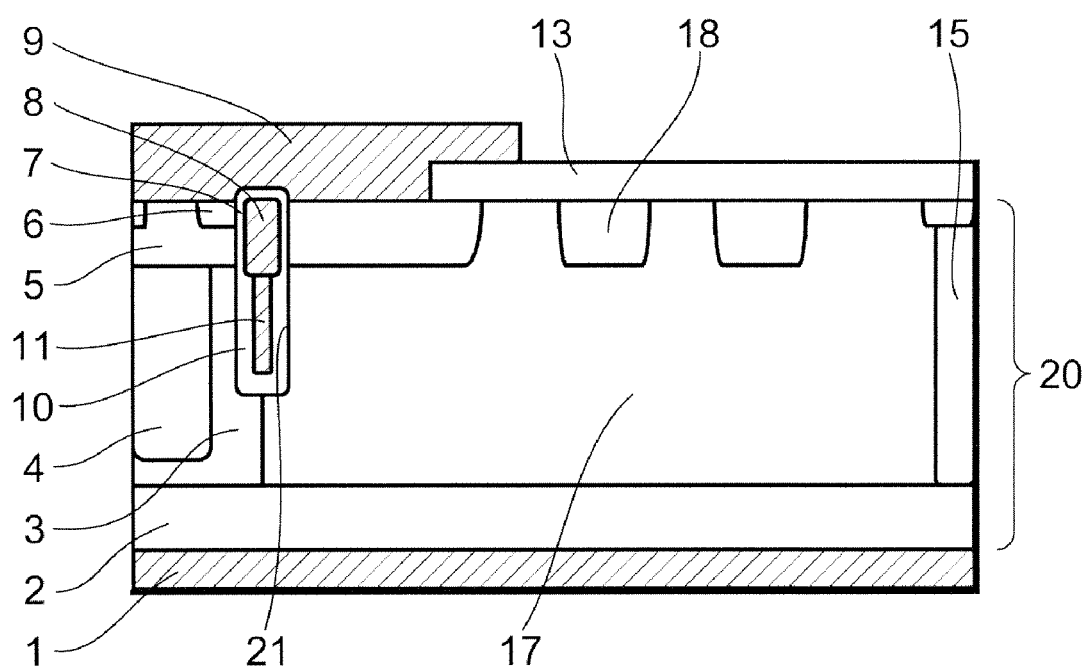
FIG. 21 is a cross-sectional view schematically illustrating a power MOSFET according to a first variation of the tenth embodiment.

FIG. 21 is a cross-sectional view schematically illustrating a power MOSFET according to this variation.

As shown in FIG. 21, in this variation, the outer edge of the drift layer is located at the same position as the outermost buried field plate electrode 11. That is, the outermost trench 21 is formed at the boundary between the n-pillar layer 3 and the n$^-$-layer 17, and a buried field plate electrode 11 is provided in this trench 21. Thus a depletion layer extends from the outermost buried field plate electrode 11 toward the n$^-$-layer 17. The configuration, operation, and effect in this variation other than the foregoing are the same as those in the tenth embodiment described above.

Next, a second variation of the tenth embodiment is described.

Figure 22:
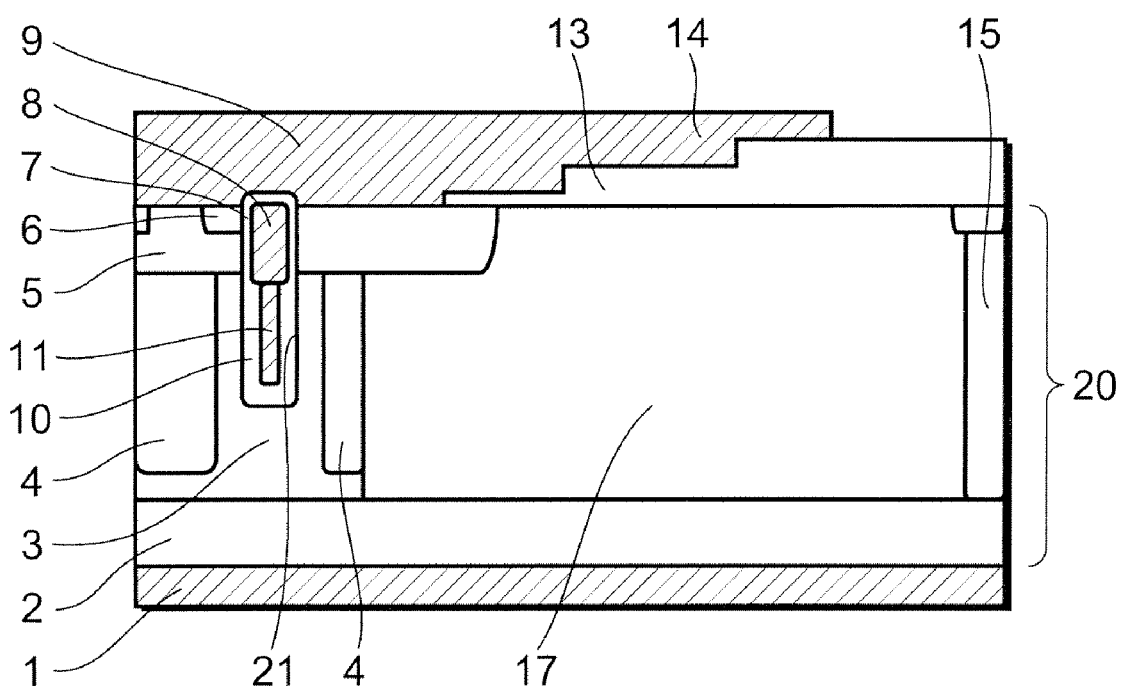
FIG. 22 is a cross-sectional view schematically illustrating a power MOSFET according to a second variation of the tenth embodiment.

FIG. 22 is a cross-sectional view schematically illustrating a power MOSFET according to this variation.

As shown in FIG. 22, this variation is a combination of a field plate structure with the tenth embodiment. The configuration, operation, and effect in this variation other than the foregoing are the same as those in the tenth embodiment described above.

Next, a third variation of the tenth embodiment is described.

Figure 23:
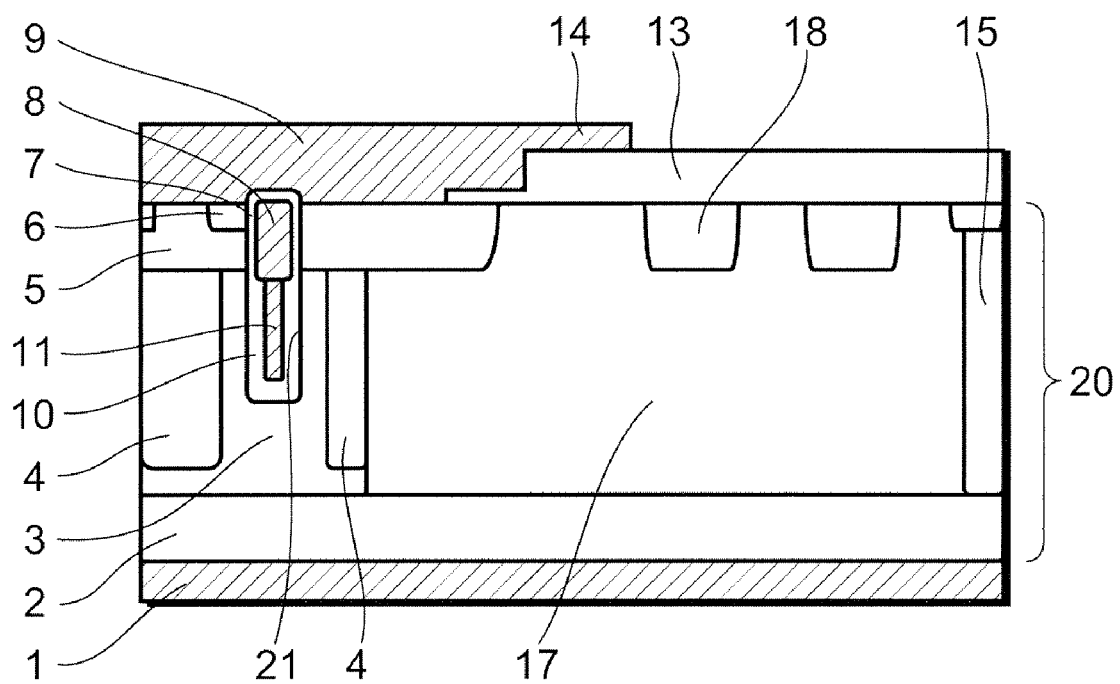
FIG. 23 is a cross-sectional view schematically illustrating a power MOSFET according to a third variation of the tenth embodiment.

FIG. 23 is a cross-sectional view schematically illustrating a power MOSFET according to this variation.

As shown in FIG. 23, this variation is a combination of a field plate structure and a guard ring structure with the tenth embodiment. The configuration, operation, and effect in this variation other than the foregoing are the same as those in the tenth embodiment described above.

Next, a fourth variation of the tenth embodiment is described.

Figure 24:
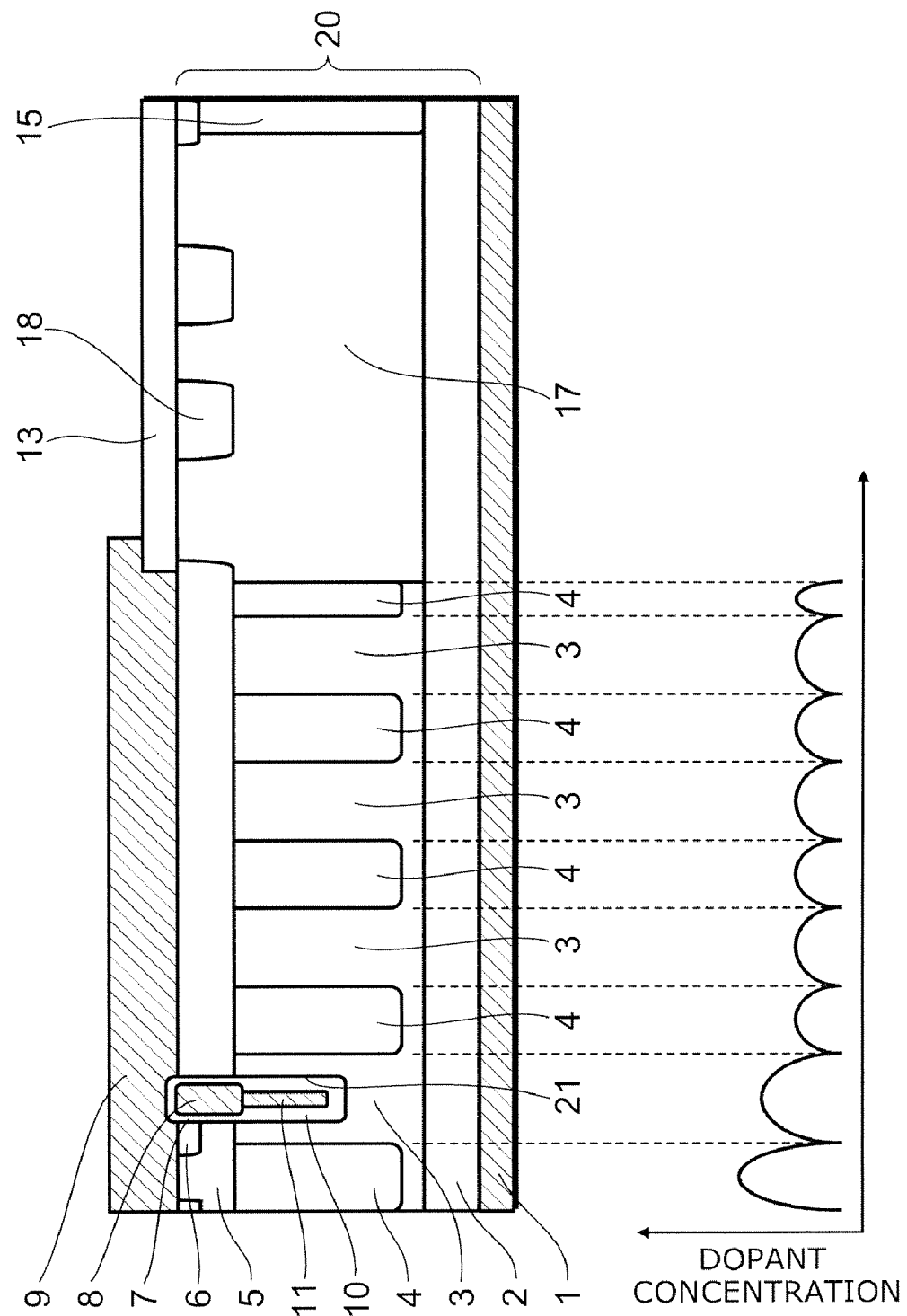
FIG. 24 is a cross-sectional view schematically illustrating a power MOSFET according to a fourth variation of the tenth embodiment, and a schematic graph illustrating dopant concentration in its pillar layers in correlation with position along the arranging direction.

FIG. 24 shows a cross-sectional view schematically illustrating a power MOSFET according to this variation, and a schematic graph illustrating dopant concentration in its pillar layers in correlation with position along the arranging direction.

As shown in FIG. 24, in this variation, in addition to the configuration of the tenth embodiment, another drift layer having lower dopant concentration in the pillar layers is formed between the normal drift layer and the n$^-$-layer 17. Also in this drift layer having lower dopant concentration, n-pillar layers 3 and p-pillar layers 4 are alternately arranged to form a super junction structure. However, no trench 21 is formed, and hence no buried field plate electrode 11 is also formed. According to this variation, by forming a drift layer having lower dopant concentration, the planar patterns of the buried field plate electrode 11 and the super junction structure can be designed independently. The configuration, operation, and effect in this variation other than the foregoing are the same as those in the tenth embodiment described above.

ELEVENTH EMBODIMENT

Figure 25:
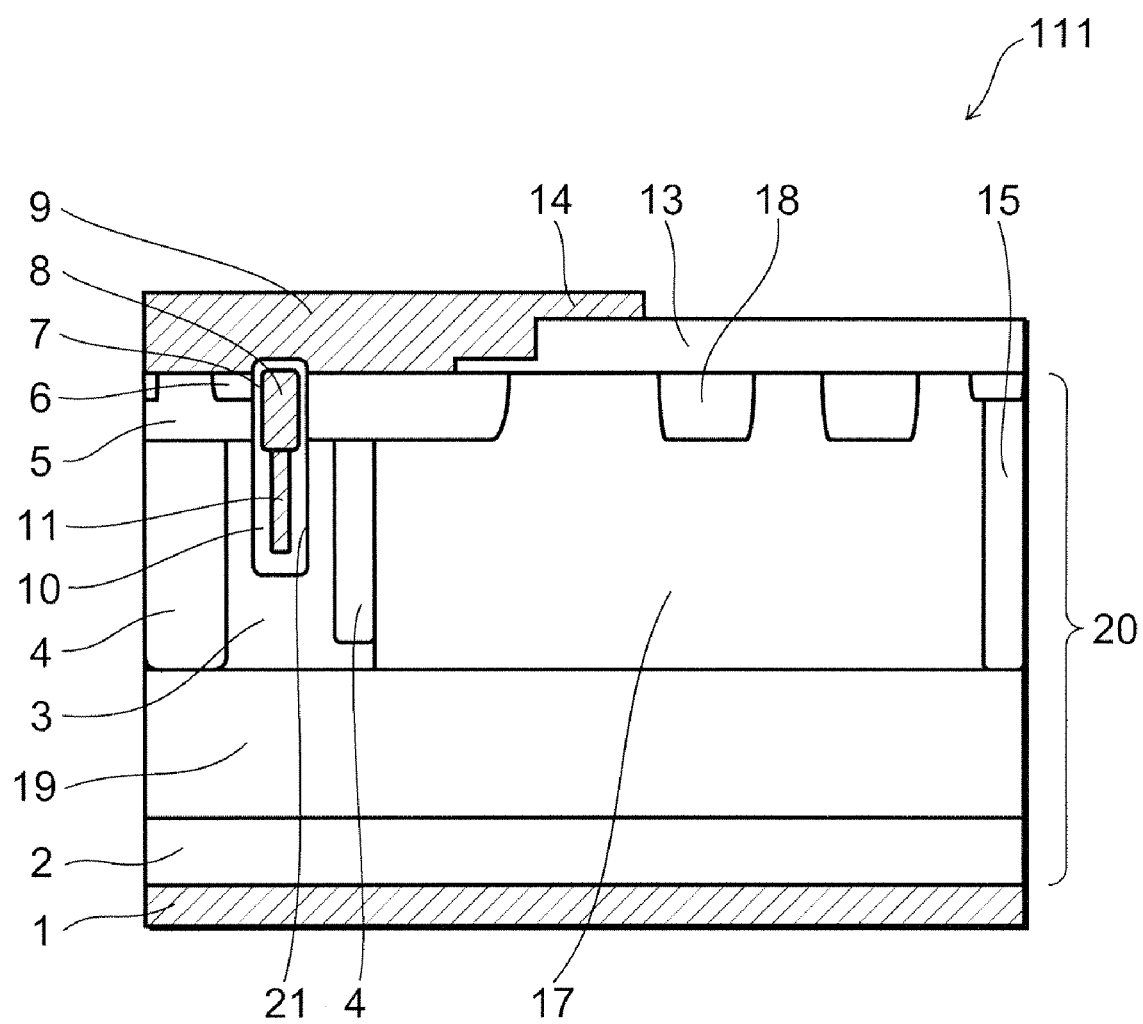
FIG. 25 is a cross-sectional view schematically illustrating a power MOSFET according to an eleventh embodiment of the invention.

FIG. 25 is a cross-sectional view schematically illustrating a power MOSFET according to an eleventh embodiment of the invention.

In FIG. 25, the detailed description of the same elements as those in FIG. 20 is omitted, and only different elements are described here.

As shown in FIG. 25, the power MOSFET 111 according to this embodiment is different from the third variation of the tenth embodiment described above in that an n⁻-layer 19 is formed between the drift layer and the n⁺-drain layer 2 constituting the super junction structure. The n-type dopant concentration in the n⁻-layer 19 is lower than the n-type dopant concentration in the n-pillar layer 3.

In this embodiment, an n⁻-layer 19 is inserted between the drift layer and the n⁺-drain layer 2. Hence the voltage held by the n⁻-layer 19 is added to the voltage held by the drift layer, and a device having higher breakdown voltage can be easily realized. Furthermore, by setting the dopant concentration in the n⁻-layer 19 to be lower than the dopant concentration in the n-pillar layer 3, the breakdown voltage can be further enhanced. The configuration, operation, and effect in this embodiment other than the foregoing are the same as those in the tenth embodiment described above.

The invention has been described with reference to the first to eleventh embodiment and the variations thereof. However, the invention is not limited to these embodiments and variations. For example, in the description of the above embodiments and the variations thereof, it is assumed that the first conductivity type and the second conductivity type are n-type and p-type, respectively. However, it is also practicable that the first conductivity type and the second conductivity type are p-type and n-type, respectively.

Some of the first to fifth embodiment illustrate a profile where the sheet dopant concentration in the p-pillar layer 4 is continuously varied. However, the same effect can be achieved even if the sheet dopant concentration varies stepwise.

Furthermore, the planar pattern of the MOS gate section and the super junction structure is not limited to the striped configuration, but may be formed in a lattice or staggered configuration. Moreover, the buried insulating film 10 and the gate insulating film 7 are not limited to the above type of insulating film. Besides silicon oxide film, they may be illustratively made of silicon nitride film, or composite film of silicon oxide film and silicon nitride film. Furthermore, the p-pillar layer 4 may be in contact with the n⁺-drain layer 2.

In the description of the above embodiments and the variations thereof, silicon (Si) is used as the semiconductor in the MOSFETs. However, compound semiconductors such as silicon carbide (SiC) or gallium nitride (GaN), or wide bandgap semiconductors such as diamond can be also used as the semiconductor.

In the description of the above embodiments and the variations thereof, the power semiconductor device is illustratively a power MOSFET. However, the invention is not limited thereto, but is also applicable to devices such as SBDs (Schottky barrier diodes), hybrid devices of MOSFETs and SBDs, SITs (static induction transistors), or IGBTs (insulated gate bipolar transistors), as long as they include a super junction structure.

The invention claimed is:

1. A power semiconductor device comprising:
    a semiconductor substrate having a plurality of trenches formed in an upper surface thereof;
    a buried insulating film formed on an inner surface of the trenches;
    a buried field plate electrode buried in the trenches;
    a control electrode insulated from the semiconductor substrate by a gate insulating film;
    a first main electrode provided on a lower side of the semiconductor substrate; and
    a second main electrode provided on an upper side of the semiconductor substrate,
    the semiconductor substrate including:
        a first semiconductor layer of a first conductivity type with its lower surface connected to the first main electrode;
        a second semiconductor layer of the first conductivity type and a third semiconductor layer of a second conductivity type formed on the first semiconductor layer and alternately arranged parallel to the upper surface of the semiconductor substrate;
        a fourth semiconductor layer of the second conductivity type formed above the second semiconductor layer and the third semiconductor layer and connected to the second main electrode; and
        a fifth semiconductor layer of the first conductivity type selectively formed in an upper surface of the fourth semiconductor layer and connected to the second main electrode,
    the buried insulating film being thicker than the gate insulating film,
    at least one of the second semiconductor layer and the third semiconductor layer having a portion with its sheet dopant concentration varying along depth direction of the semiconductor substrate, the sheet dopant concentration in the third semiconductor layer being higher than the sheet dopant concentration in the second semiconductor layer in an upper part of the portion with varying sheet dopant concentration, and the sheet dopant concentration in the third semiconductor layer being lower than the sheet dopant concentration in the second semiconductor layer in a lower part of the portion.

2. The power semiconductor device according to claim 1, wherein the buried field plate electrode is connected to the control electrode.

3. The power semiconductor device according to claim 2, wherein the buried field plate electrode is integrally formed with the control electrode.

4. The power semiconductor device according to claim 1, wherein the trenches are shallower than the third semiconductor layer.

5. The power semiconductor device according to claim 4, wherein dopant concentration in the second semiconductor layer and the third semiconductor layer is relatively high in a region between the trenches and relatively low in a region below the trenches.

6. The power semiconductor device according to claim 4, wherein dopant concentration in a portion below the buried field plate electrode in the third semiconductor layer monotonically decreases downward from an upper end of the portion.

7. The power semiconductor device according to claim 5, wherein a slope of dopant concentration in a portion below the buried field plate electrode in the third semiconductor layer is smaller than a slope of dopant concentration in a portion between the buried field plate electrodes in the third semiconductor layer.

8. The power semiconductor device according to claim 4, further comprising a sixth semiconductor layer of the second conductivity type formed at a bottom of the trenches.

9. The power semiconductor device according to claim 1, wherein the buried field plate electrode, the second semiconductor layer and the third semiconductor layer are formed in a striped configuration, respectively.

10. The power semiconductor device according to claim 9, wherein as viewed from above, an extending direction of the second semiconductor layer and the third semiconductor layer is orthogonal to an extending direction of the buried field plate electrode.

11. The power semiconductor device according to claim 10, wherein an arrangement pitch of the buried field plate electrode is smaller than an arrangement pitch of the second semiconductor layer and the third semiconductor layer.

12. The power semiconductor device according to claim 1, further comprising a sixth semiconductor layer of the first conductivity type formed in a termination region and, and having a dopant concentration which is smaller than a dopant concentration in the second semiconductor layer,
the second semiconductor layer and the third semiconductor layer being not formed in the termination region.

13. The power semiconductor device according to claim 12, further comprising an seventh semiconductor layer of the second conductivity type formed in an upper surface of the seventh semiconductor layer.

14. The power semiconductor device according to claim 12, further comprising a field insulating film formed on the semiconductor substrate in the termination region, and a field plate electrode formed on the field insulating film and connected to the second main electrode or the control electrode.

15. The power semiconductor device according to claim 14, further comprising an seventh semiconductor layer of the second conductivity type formed in an upper surface of the seventh semiconductor layer.

16. The power semiconductor device according to claim 1, further comprising a sixth semiconductor layer of the first conductivity type formed between the first semiconductor layer and the second semiconductor layer and between the first semiconductor layer and the third semiconductor layer, and having a dopant concentration which is smaller than a dopant concentration in the second semiconductor layer.

17. A power semiconductor device comprising:
a semiconductor substrate having a plurality of trenches formed in an upper surface thereof;
a buried insulating film formed on an inner surface of the trenches;
a buried field plate electrode buried in the trenches;
a control electrode insulated from the semiconductor substrate by a gate insulating film;
a first main electrode provided on a lower side of the semiconductor substrate; and
a second main electrode provided on an upper side of the semiconductor substrate,
the semiconductor substrate including:
a first semiconductor layer of a first conductivity type with its lower surface connected to the first main electrode;
a second semiconductor layer of the first conductivity type and a third semiconductor layer of a second conductivity type formed on the first semiconductor layer and alternately arranged parallel to the upper surface of the semiconductor substrate;
a fourth semiconductor layer of the second conductivity type formed above the second semiconductor layer and the third semiconductor layer and connected to the second main electrode; and
a fifth semiconductor layer of the first conductivity type selectively formed in an upper surface of the fourth semiconductor layer and connected to the second main electrode,
electric field strength in the second semiconductor layer and the third semiconductor layer along depth direction of the semiconductor substrate having a maximum value in a part other than an upper end and a lower end of the second semiconductor layer and the third semiconductor layer.

18. The power semiconductor device according to claim 17, wherein the electric field strength in the second semiconductor layer and the third semiconductor layer decreases from a center of the semiconductor substrate along a thickness direction toward upper and lower ends.

19. The power semiconductor device according to claim 18, wherein in an upper part of the second semiconductor layer and the third semiconductor layer, a sheet dopant concentration in the third semiconductor layer is higher than a sheet dopant concentration in the second semiconductor layer, and in a lower part of the second semiconductor layer and the third semiconductor layer, the sheet dopant concentration in the third semiconductor layer is lower than the sheet dopant concentration in the second semiconductor layer.

20. The power semiconductor device according to claim 18, wherein the buried insulating film has a portion whose thickness varies along the thickness direction of the semiconductor substrate, and the thickness of the buried insulating film increases downward in the portion.

* * * * *